(12) United States Patent
Kouma et al.

(10) Patent No.: US 7,439,184 B2
(45) Date of Patent: Oct. 21, 2008

(54) METHOD OF MAKING COMB-TEETH ELECTRODE PAIR

(75) Inventors: Norinao Kouma, Kawasaki (JP);
Osamu Tsuboi, Kawasaki (JP);
Hiromitsu Soneda, Kawasaki (JP);
Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 171 days.

(21) Appl. No.: 11/371,089

(22) Filed: Mar. 9, 2006

(65) Prior Publication Data

US 2006/0203319 A1 Sep. 14, 2006

(30) Foreign Application Priority Data

Mar. 11, 2005 (JP) ............................. 2005-069155

(51) Int. Cl.
*H01L 21/311* (2006.01)
(52) U.S. Cl. ....................... 438/694; 438/737; 438/753; 257/E21.305
(58) Field of Classification Search ................. 438/669, 438/694, 737, 753; 216/17; 257/E21.305, 257/E21.307
See application file for complete search history.

(56) References Cited

U.S. PATENT DOCUMENTS

| 6,423,563 | B2 | 7/2002 | Fukada et al. |
| 2002/0005976 | A1* | 1/2002 | Behin et al. ................. 359/254 |

FOREIGN PATENT DOCUMENTS

| JP | 10-190007 | 7/1998 |
| JP | 10-270714 | 10/1998 |
| JP | 2000-31502 | 1/2000 |
| WO | WO 01/74707 | 10/2001 |

* cited by examiner

*Primary Examiner*—Caridad M Everhart
(74) *Attorney, Agent, or Firm*—Kratz, Quintos & Hanson, LLP

(57) ABSTRACT

A pair of comb-teeth electrodes are made from a material substrate including a first conduction layer, a second conduction layer and an intervening insulation layer. The paired electrodes includes first and second comb-teeth electrodes. The first comb-teeth electrode is composed of a first conductor derived from the first conduction layer, a second conductor derived from the second conduction layer and an insulator derived from the insulation layer. The second comb-teeth electrode is derived from the second conduction layer.

5 Claims, 28 Drawing Sheets

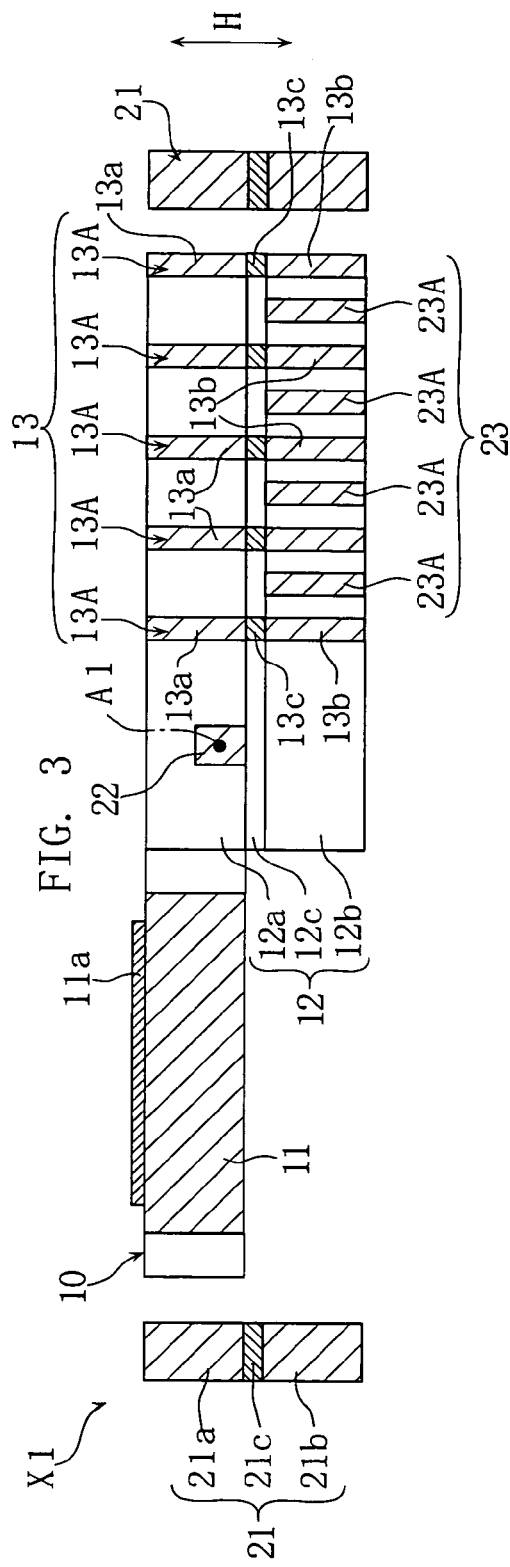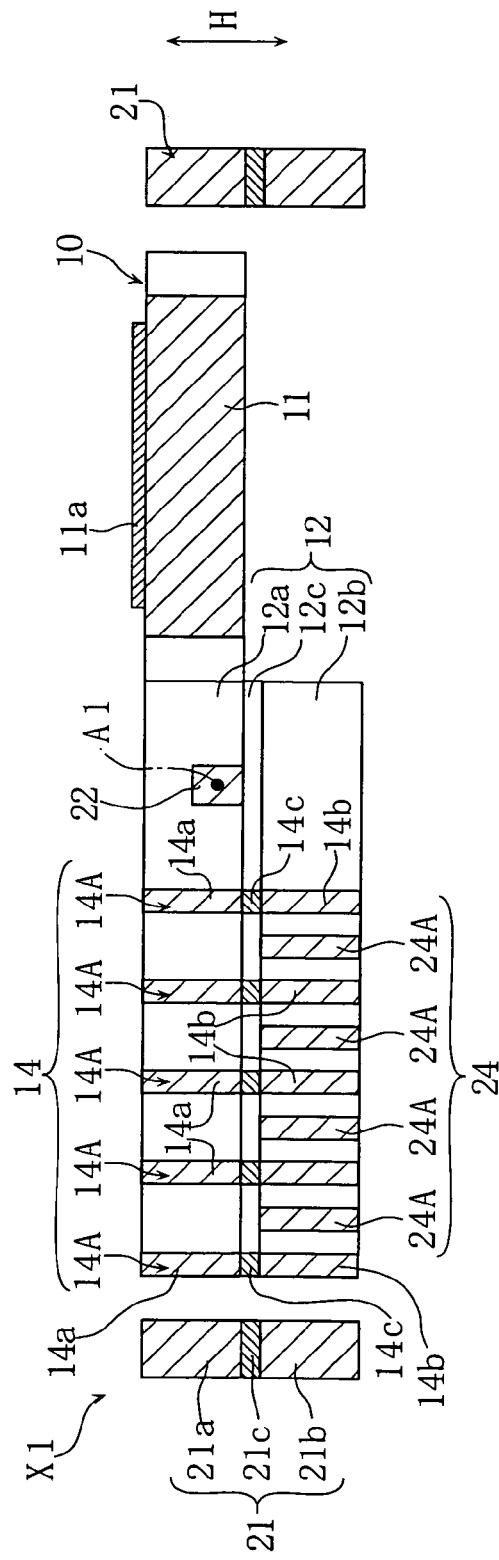

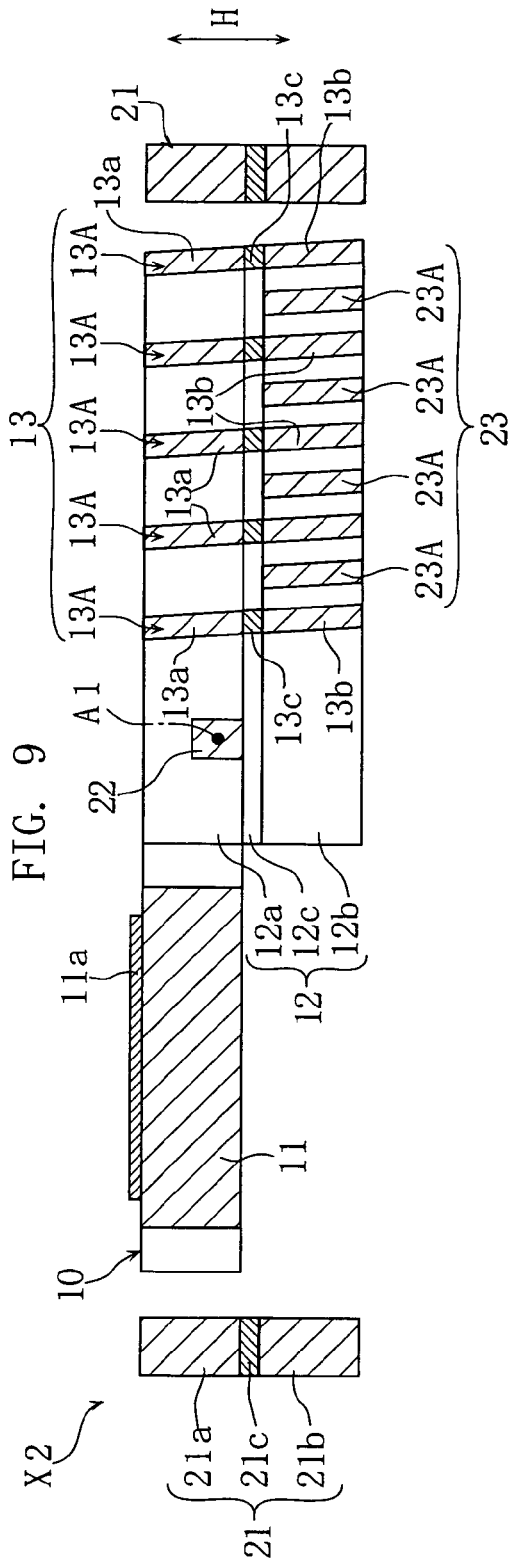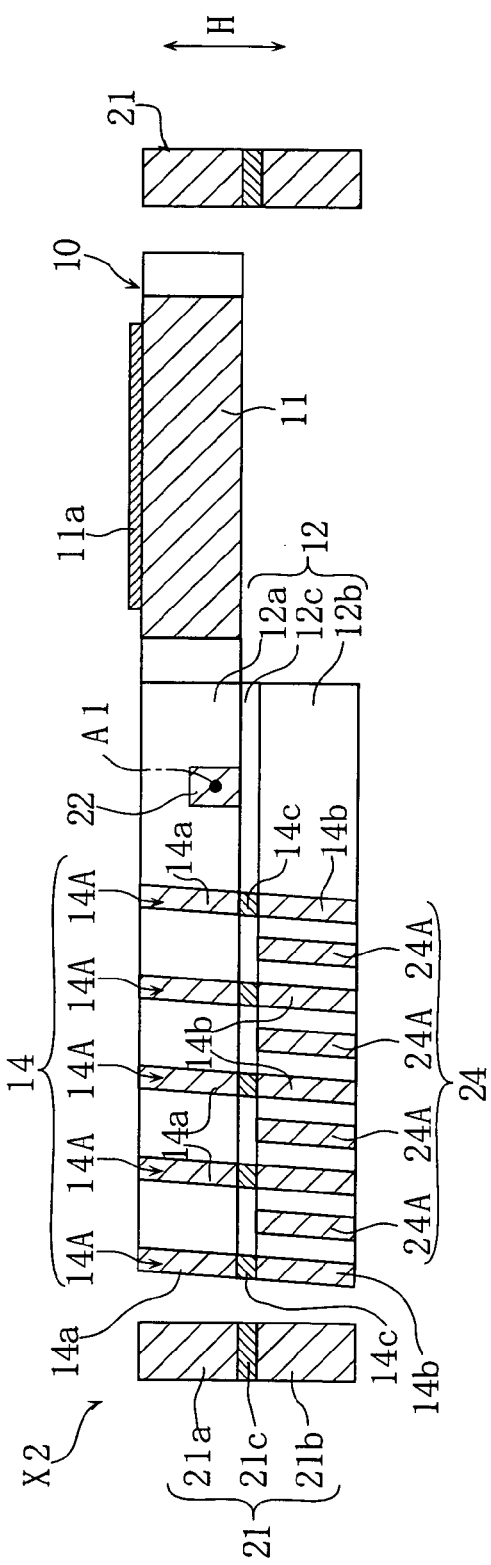

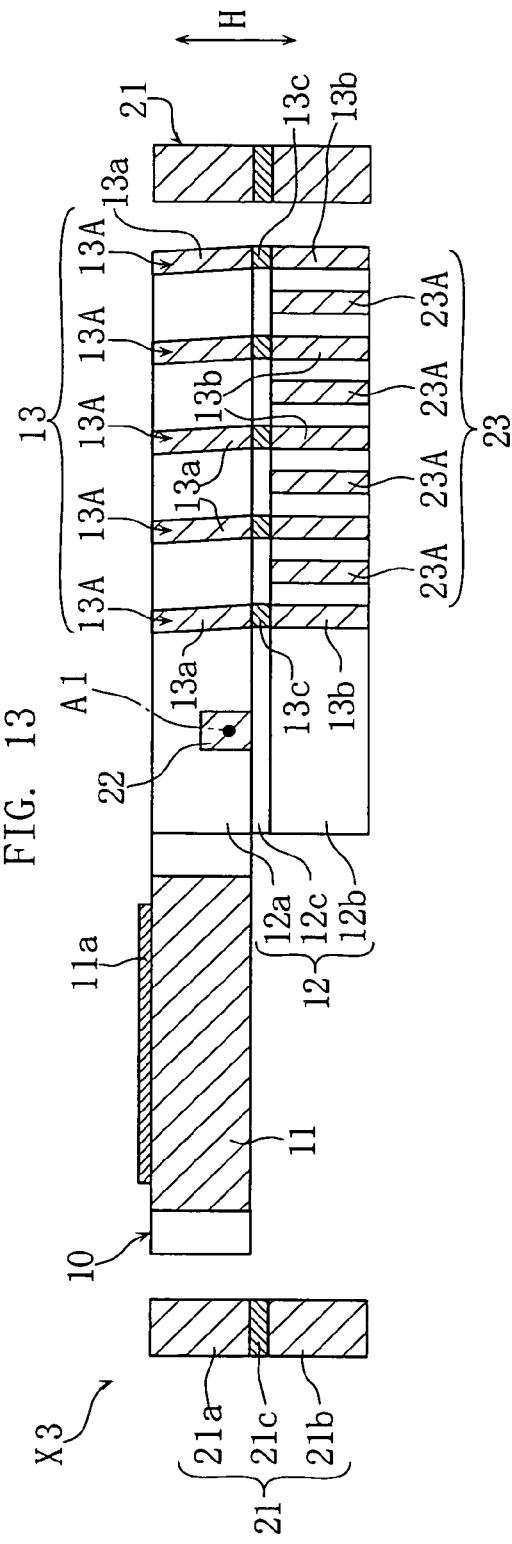
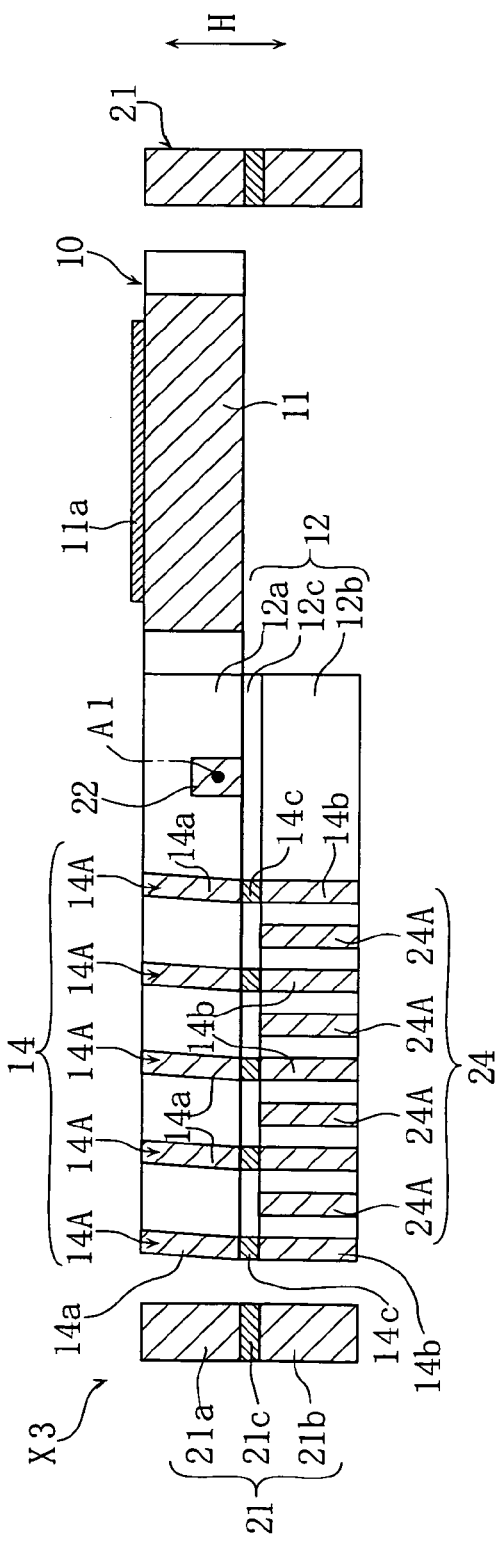

FIG. 15
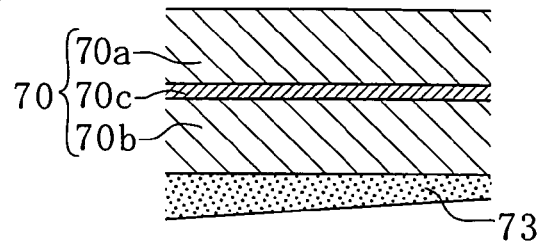
(a)
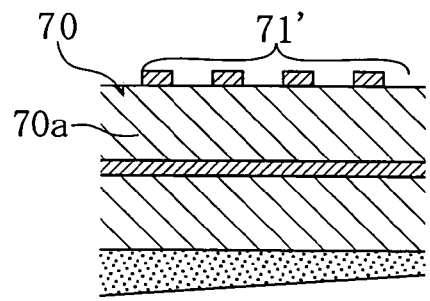
(b)
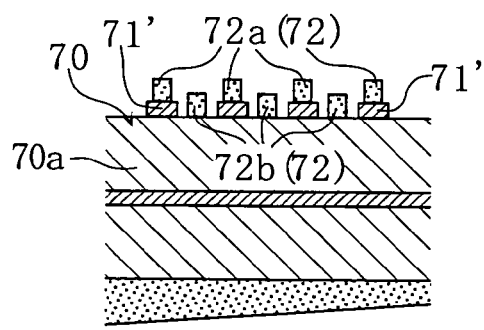
(c)
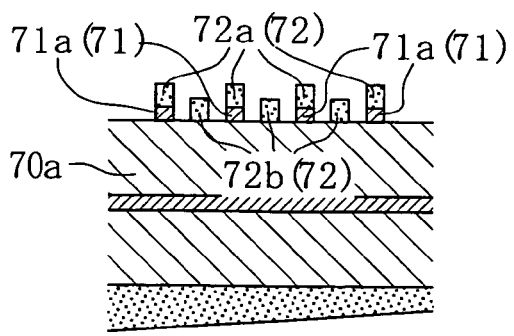
(d)
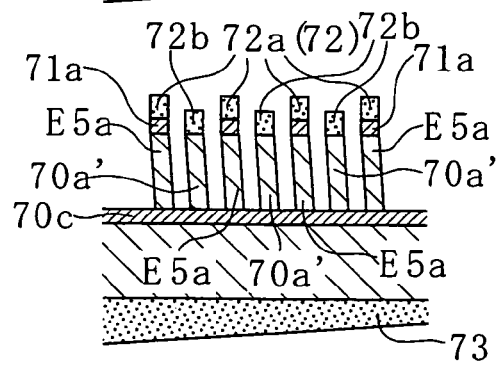
(e)

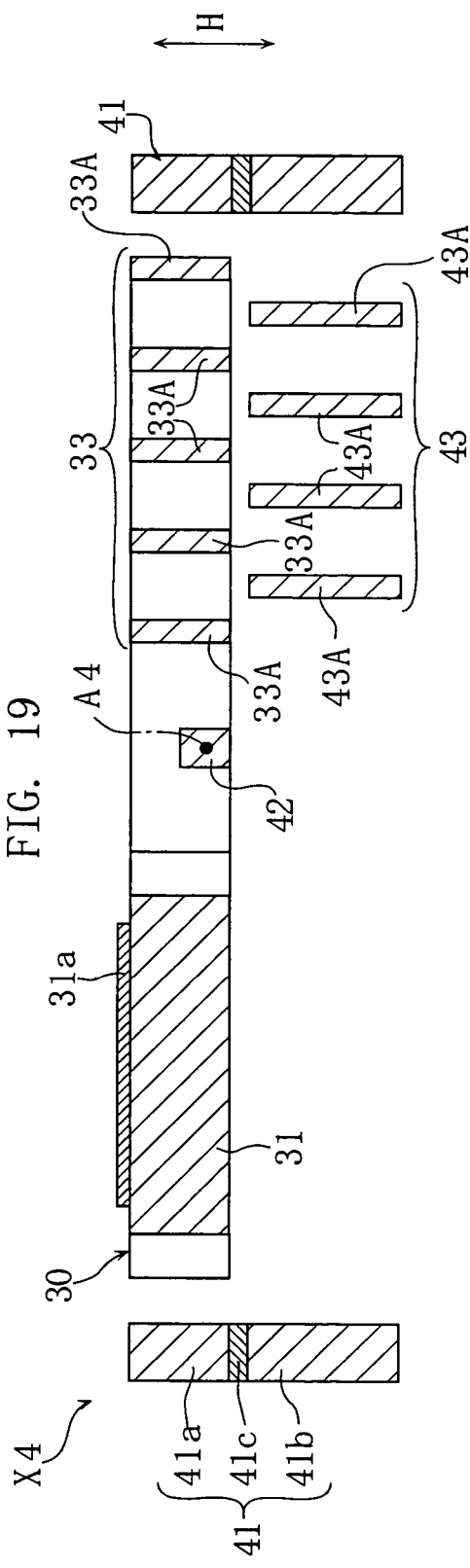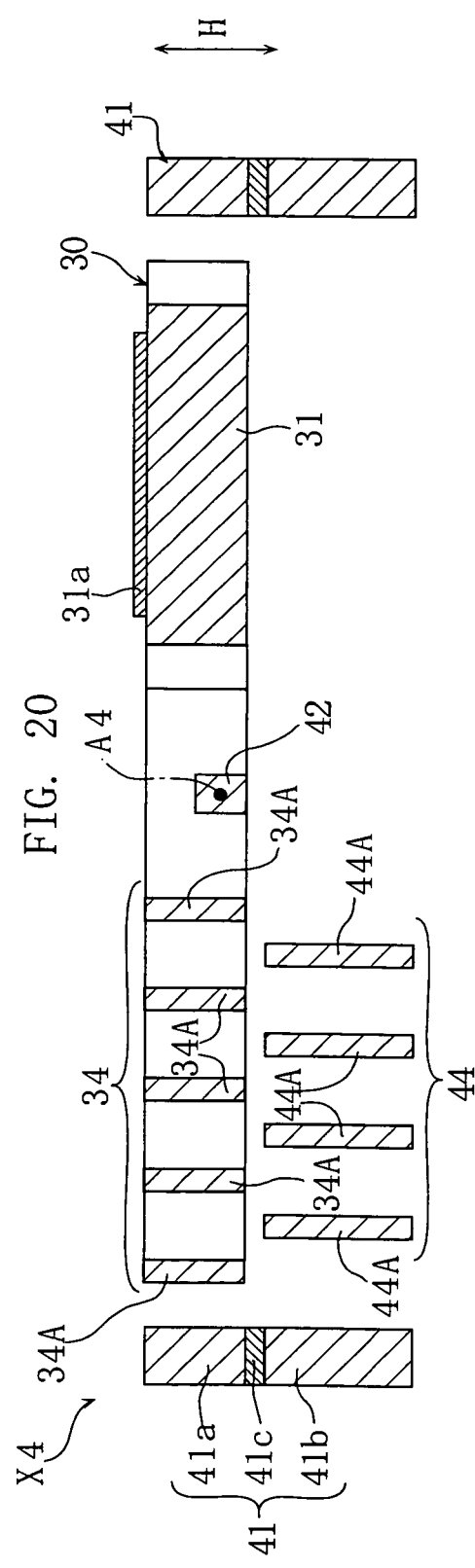

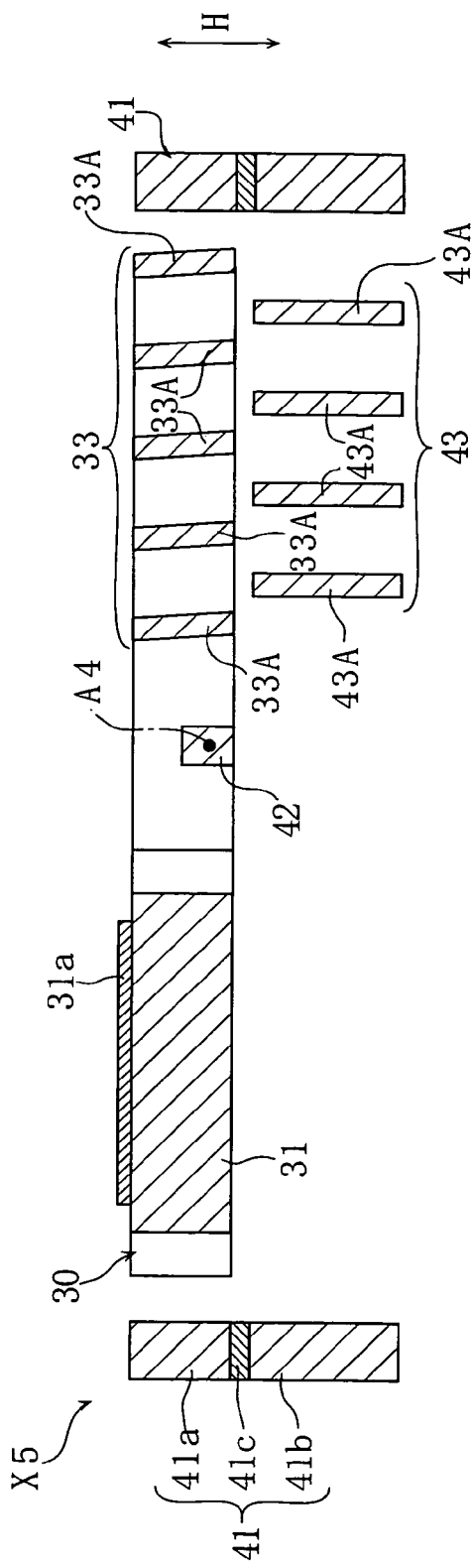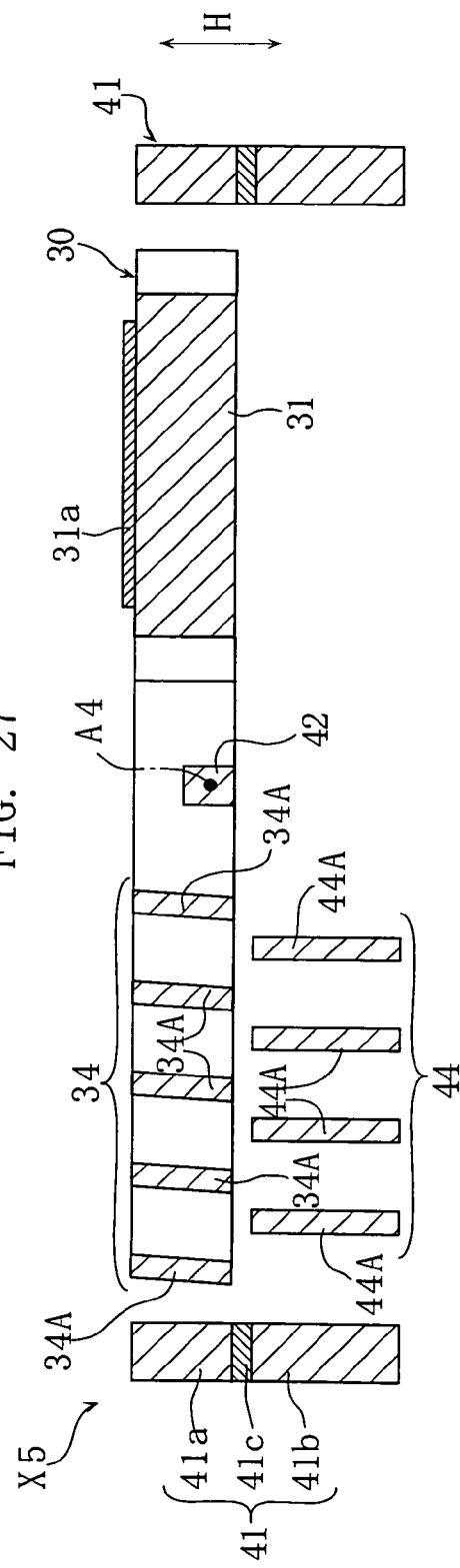

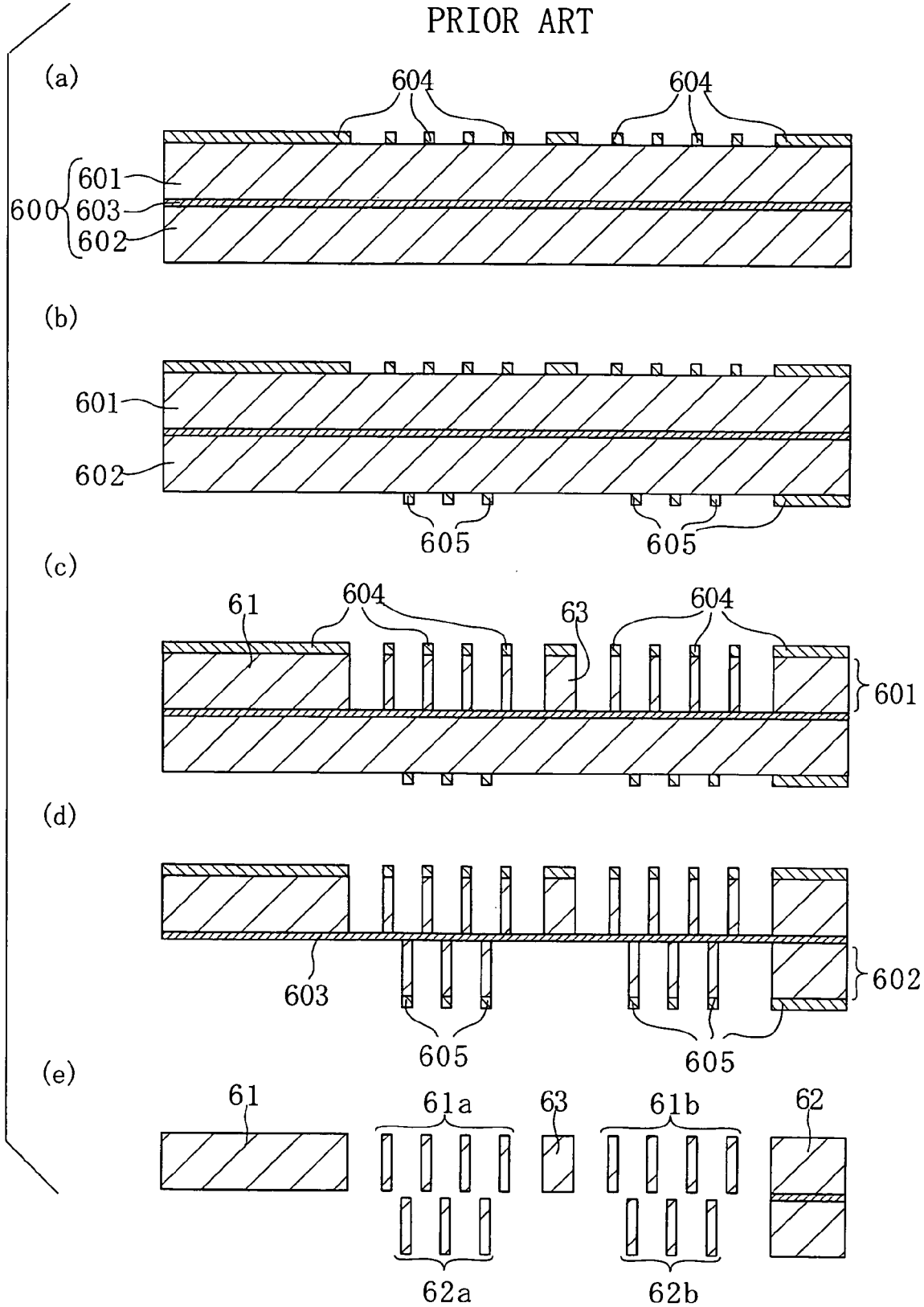

METHOD OF MAKING COMB-TEETH ELECTRODE PAIR

BACKGROUND OF THE INVENTION

1. Field of the Invention

The present invention relates to methods of making comb-teeth electrode pairs in a micro oscillating element which includes a rotationally displaceable oscillating portion. The electrode pair can be a pair of comb-teeth electrodes as part of a drive mechanism which drives the oscillating portion, or a pair of comb-teeth electrodes as part of a detection mechanism for detecting the amount of rotational displacement of the oscillating element.

2. Description of the Related Art

In recent years, efforts have been made for making practical use of elements which have a micro-structure formed by micromachining technology. In the field of optical communications technology for example, micromirror elements which are tiny elements capable of reflecting light are gathering attention. In the filed of sensing, attention is paid to tiny acceleration sensors capable of detecting acceleration as well as tiny angular speed sensors capable of detecting angular speed.

In the optical communications, optical fibers serve as a medium through which optical signals are passed. When the optical signal passing through a given optical fiber is switched to another optical fiber, so-called optical switching devices are used in general. In order to achieve high quality optical communications, the optical switching device must have such characteristics as high capacity, high speed and high reliability, in switching action. In view of these, micromirror elements manufactured by utilizing micromachining technology are gathering attention as a switching element to be incorporated in the optical switching devices. The micromirror elements enable the switching operation without converting optical signals into electric signals between the optical paths on the input side and the output side of the optical switching device. This is advantageous in achieving the above-mentioned characteristics. Micromachining technologies are disclosed in the following Patent Documents 1 through 3 for example.

Patent Document 1: JP-A-10-190007
Patent Document 2: JP-A-10-270714
Patent Document 3: JP-A-2000-31502

FIG. 31 is a partially non-illustrated exploded perspective view of a conventional micromirror element X6 manufactured by micromachining technology. The micromirror element X6 includes: a mirror support 61 which has an upper surface provided with a mirror surface 64; a frame 62 (partially non-illustrated); and a pair of torsion bars 63 connecting these. The mirror support 61 has a pair of ends formed with a pair of comb-teeth electrodes 61a, 61b. The frame 62 is formed with a pair of inwardly extended comb-teeth electrodes 62a, 62b correspondingly to the comb-teeth electrode 61a, 61b. The torsion bars 63 provide an axis for oscillating action of the mirror support 61 with respect to the frame 62.

According to the micromirror element X6 which has the structure as described, a set of comb-teeth electrodes which are placed closely to each other for generation of electrostatic force, e.g. the comb-teeth electrodes 61a, 62a, are apart from each other, making an upper and a lower steps as shown in FIG. 32A when no voltage is applied. When a predetermined voltage is applied on the other hand, as shown in FIG. 32(b), the comb-teeth electrode 61a is drawn in between the comb-teeth electrode 62a while rotationally displacing the mirror support 61. More specifically, when the comb-teeth electrodes 61a, 62a are supplied with a predetermined voltage and whereby the comb-teeth electrode 61a is positively charged and the comb-teeth electrode 62a is negatively charged, then there is static attraction developed between the comb-teeth electrodes 61a, 62a, which causes the mirror support 61 to make a rotational displacement around the axis A6 while twisting the torsion bars 63. By utilizing such an oscillating motion of the mirror support 61, it is possible to switch directions in which light is reflected by the mirror surface 64 on the mirror support.

FIG. 33 shows a manufacturing method for the micromirror element X6. In FIG. 33, views of a section are given to illustrate a process of forming those components which are shown in FIG. 31, i.e. part of the mirror support 61, the frame 62, the torsion bars 63, part of a pair of comb-teeth electrodes 61a, 62a, and part of a pair of comb-teeth electrodes 61b, 62b. The section represents a section of a material substrate (a wafer) to which the manufacturing processes is performed, and more specifically a section of a single block from which a single micromirror element is formed. The section includes sections of a plurality of component regions, and the sectional views are illustrative sequential depictions.

In the method of manufacturing the micromirror element X6, first, a mask pattern 604 is formed on a material substrate 600 as shown in FIG. 33(a). The material substrate 600 is a so called SOI (Silicon on Insulator) wafer, which has a laminate structure including a silicon layer 601 and a silicon layer 602, and an insulation layer 603 between them. The mask pattern 604 has a pattern for masking predetermined regions (including the comb-teeth electrodes 61a, 61b) on the micromirror element X6. The mask pattern 604 is formed by first forming a film of a predetermined mask material on the silicon layer 601, and then patterning the film.

In the manufacture of the micromirror element X6, next, a mask pattern 605 is formed on the silicon layer 602 as shown in FIG. 33(b). The mask pattern 605 has a pattern for masking predetermined regions (including the comb-teeth electrodes 62a, 62b) on the micromirror element X6. The mask pattern 605 is formed by first forming a film of a predetermined mask material on the silicon layer 602, and then patterning the film, while positioning the pattern to the mask pattern 604 which is on the silicon layer 601.

Next, as shown in FIG. 33(c), an anisotropic etching process is performed to the silicon layer 601 via the mask pattern 604, whereby formation is made for structures (the mirror support 61, part of the frame 62, the torsion bars 63, and the comb-teeth electrodes 61a, 61b) which are due on the silicon layer 601.

Next, as shown in FIG. 33(d), an anisotropic etching process is performed to the silicon layer 602 via the mask pattern 605, whereby formation is made for structures (part of the frame 62, and the comb-teeth electrodes 62a, 62b) which are due on the silicon layer 602.

Next, as shown in FIG. 33(e), isotropic etching is performed to the insulation layer 603 to remove exposed portions of the insulation layer 603. The above described process yields the mirror support 61, the frame 62, the torsion bars 63, the comb-teeth electrodes 61a, 62a, and the comb-teeth electrodes 61b, 62b.

According to the conventional method, as has been described above while making reference to FIG. 33(b), pattern formation in the mask pattern 605 must be made while positioning the pattern with respect to the mask pattern 604. However, it is difficult to do this positioning highly accurately because the mask pattern 604 is patterned on the silicon layer 601 in the material substrate 600 whereas the mask pattern 605 must be patterned on the silicon layer 602 which is on the side away from the silicon layer 601. According to the above-described convention, the mask pattern 604 includes portions for masking the comb-teeth electrodes 61a, 61b, and the mask pattern 605 includes portions for masking the comb-teeth electrodes 62a, 62b. Yet, because it is difficult to pattern the mask pattern 605 highly precisely at a position with respect to the mask pattern 604, it is difficult to achieve a high level of accuracy in the manufactured product or the micromirror element X6, in terms of relative positions between the comb-teeth electrodes 61a and 62a as well as relative positions between the comb-teeth electrodes 61b and 62b. In other words, according to the above-described convention, it is difficult to form the comb-teeth electrodes 61a, 62a at a high level of alignment accuracy, and it is difficult to form the comb-teeth electrodes 61b, 62b at a high level of alignment accuracy. If the comb-teeth electrodes 61a, 62a do not have sufficient alignment accuracy, when driving the element by applying a predetermined voltage to the comb-teeth electrodes 61a, 62a, an undesirable situation called pull-in phenomenon can develop in which the comb-teeth electrodes 61a, 62a come to contact with each other as a result of mutual attraction. Likewise, if the comb-teeth electrodes 61b, 62b do not have sufficient alignment accuracy, when driving the element by applying a predetermined voltage to the comb-teeth electrodes 61b, 62b, an undesirable situation called pull-in phenomenon can develop in which the comb-teeth electrodes 61b, 62b come to contact with each other as a result of mutual attraction. The pull-in phenomenon must be avoided since it is a hindrance to the element's oscillating drive and oscillating operation.

SUMMARY OF THE INVENTION

The present invention was made under the circumstances described above, and it is therefore an object of the present invention to provide a method which is suitable for forming a pair of comb-teeth electrodes at a high level of alignment accuracy.

A first aspect of the present invention provides a method of making a pair of comb-teeth electrodes from a material substrate which has a laminate structure including a first conduction layer, a second conduction layer and an insulation layer between the first and the second conduction layers. The comb-teeth electrodes include: a first comb-teeth electrode which has a laminate structure composed of a first conductor derived from the first conduction layer, a second conductor derived from the second conduction layer and an insulator derived from the insulation layer; and a second comb-teeth electrode derived from the second conduction layer. The method includes: a step of forming a prep first mask pattern on the first conduction layer; a step of forming a second mask pattern which includes a first mask portion on the prep first mask pattern for the first comb-teeth electrode and a second mask portion on the first conduction layer for the second comb-teeth electrode, over the prep first mask pattern and the first conduction layer; a first etching step of etching the prep first mask pattern via the second mask pattern for forming from the prep first mask pattern a first mask pattern which includes a third mask portion patterned to follow first mask portion of the second mask pattern, for the first comb-teeth electrode; a second etching step of etching the first conduction layer via the first and the second mask patterns until the insulation layer is reached, to form the first conductor masked by a stack of the first and the third mask portions and a first remaining mask portion masked by the second mask portion, in the first conduction layer; a third etching step of etching the insulation layer from a side on the first conduction layer until the second conduction layer is reached, to form the insulator masked by the first conductor and a second remaining mask portion masked by the first remaining mask portion, in the insulation layer; a step of removing the second mask pattern; and a fourth etching step of etching the second conduction layer from a side on the first conduction layer, to remove the first remaining mask portion and form the second conductor contacting the insulator and the second comb-teeth electrode masked by the second remaining mask portion, in the second conduction layer. The step of removing the second mask pattern may be performed before or after the fourth etching step. The comb-teeth electrodes pair (the first and the second comb-teeth electrodes) made by the present method is applicable to a micro oscillating element provided with a rotationally displaceable rocker, as a drive mechanism for driving the rocker (so called comb-teeth-electrode actuator), or as a detection mechanism for detection of the amount of rotational displacement of the rocker.

According to the present method, the first and the second mask portions of the second mask pattern are patterned on the same side of the material substrate, and therefore it is possible to achieve a high level of accuracy in terms of relative position of formation of the first and the second mask portions. At the same time, the third mask portion of the first mask pattern is formed by etching in the first etching step after the formation of the second mask pattern, using the second mask pattern as a mask, and into a pattern following the shape of the first mask portion of the second mask pattern. Therefore, according to the present method, it is possible to achieve a high level of accuracy in terms of relative position of formation of the second and the third mask portions. In other words, according to the present method, highly accurate positioning is achieved by self alignment between the third mask portion of the first mask pattern and the second mask portion of the second mask pattern, on the same side of the material substrate. (Specifically, positioning of the third mask portion with respect to the second mask portion is achieved essentially through patterning of the third mask portion by the first mask portion which is included in the same mask pattern as the second mask portion.) Thus, in the second etching step according to the present method, the first conduction layer yields the first conductor which is shaped to follow the shape of the third mask portion, and the first remaining mask portion which is shaped to follow the shape of the second mask portion. In the third etching step, the insulation layer yields the insulator which is shaped to follow the shape of the first conductor (therefore, the third mask portion), and the second remaining mask portion which is shaped to follow the shape of the first remaining mask portion (therefore the second mask portion). In the fourth etching step, the second conduction layer yields the second conductor which is shaped to follow the shape of the insulator (therefore the third mask portion), and the second comb-teeth electrode which is shaped to follow the shape of the second remaining mask portion (therefore the second mask portion). Therefore, according to the present method, it is possible to form the first comb-teeth electrode which has a laminate structure including the first conductor, the insulator and the second conductor, and the second comb-teeth electrode at a high level of alignment accuracy.

According to the first aspect of the present invention, the first conductor and the first remaining mask portion may be formed on an inclination with respect to a thickness direction of the material substrate in the second etching step. Further, the second conductor and the second comb-teeth electrode may be formed on an inclination with respect to a thickness direction of the material substrate in the fourth etching step.

A second aspect of the present invention provides a method of making a pair of comb-teeth electrodes from a material substrate which has a laminate structure including a first conduction layer, a second conduction layer and an insulation layer between the first and the second conduction layers. The comb-teeth electrodes includes a first comb-teeth electrode derived from the first conduction layer and a second comb-teeth electrode derived from the second conduction layer. The method includes: a step of forming a prep first mask pattern on the first conduction layer; a step of forming a second mask pattern which includes a first mask portion on the prep first mask pattern for the first comb-teeth electrode, and a second mask portion on the first conduction layer for the second comb-teeth electrode, over the prep first mask pattern and the first conduction layer; a first etching step of etching the prep first mask pattern via the second mask pattern for forming from the prep first mask pattern a first mask pattern which includes a third mask portion patterned to follow first mask portion of the second mask pattern, for the first comb-teeth electrode; a step of forming a third mask pattern which includes a fourth mask portion for the second comb-teeth electrode, on the second conduction layer; a second etching step of etching the first conduction layer via the first and the second mask patterns until the insulation layer is reached, to form the first comb-teeth electrode masked by a stack of the first and the third mask portions and a first remaining mask portion masked by the second mask portion, in the first conduction layer; a third etching step of etching the insulation layer from a side on the first conduction layer until the second conduction layer is reached, to form a second remaining mask portion masked by the first remaining mask portion, in the insulation layer; a step of removing the second mask pattern; a fourth etching step of etching the second conduction layer from a side on the first conduction layer in a direction of a thickness of the second conduction layer a midway thereof, to remove the first remaining mask portion and form part of the second comb-teeth electrode masked by the second remaining mask portion, in the second conduction layer; and a fifth etching step of etching the second conduction layer via the third mask pattern, to form the remaining part of the second comb-teeth electrode. The step of forming the third mask pattern may be performed before or after the formation of the prep first, the second or the first mask pattern. The step of removing the second mask pattern may be performed before the fourth etching step or after the fourth or the fifth etching step. The comb-teeth electrodes pair (the first and the second comb-teeth electrodes) made by the present method is applicable to a micro oscillating element provided with a rotationally displaceable rocker, as a drive mechanism for driving the rocker (so called comb-teeth-electrode actuator), or as a detection mechanism for detection of the amount of rotational displacement of the rocker.

According to the present method, the first and the second mask portions of the second mask pattern are patterned on the same side of the material substrate, and therefore it is possible to achieve a high level of accuracy in terms of relative position of formation of the first and the second mask portions. At the same time, the third mask portion of the first mask pattern is formed by etching in the first etching step after the formation of the second mask pattern, using the second mask pattern as a mask, and into a pattern following the shape of the first mask portion of the second mask pattern. Therefore, according to the present method, it is possible to achieve a high level of accuracy in terms of relative position of formation of the second and the third mask portions. In other words, according to the present method, highly accurate positioning is achieved by self alignment between the third mask portion of the first mask pattern and the second mask portion of the second mask pattern, on the same side of the material substrate. Thus, in the second etching step according to the present method, the first conduction layer yields the first comb-teeth electrode which is shaped to follow the shape of the third mask portion, and the first remaining mask portion which is shaped to follow the shape of the second mask portion. In the third etching step, the insulation layer yields the second remaining mask portion which is shaped to follow the shape of the first remaining mask portion (therefore the second mask portion). In the fourth etching step, the second conduction layer yields part of the second comb-teeth electrode (part of the second comb-teeth electrode closer to the first comb-teeth electrode) which is shaped to follow the shape of the second remaining mask portion (therefore the second mask portion). Therefore, according to the present method, it is possible to form the first comb-teeth electrode and part of the second comb-teeth electrode which is closer to the first comb-teeth electrode at a high level of alignment accuracy. According to the present method, the remaining part of the second comb-teeth electrode (part of the second comb-teeth electrode which is farther from the first comb-teeth electrode) is formed by an etching process in the fifth etching step, using a fourth mask portion of the third mask pattern as a mask. However, there are cases in which formation position of part of the second comb-teeth electrode farther from the first comb-teeth electrode may not be as accurate as is the formation position of part of the second comb-teeth electrode closer to the first comb-teeth electrode with respect to the first comb-teeth electrode. In such a case, the second aspect of the present invention present enables to form a pair of comb-teeth electrodes at a practically high level of alignment accuracy in terms of relative position of formation.

According to the second aspect of the present invention, the first comb-teeth electrode and the first remaining mask portion may be formed on an inclination with respect to a thickness direction of the material substrate in the second etching step.

BRIEF DESCRIPTION OF THE DRAWINGS

FIG. 3 is a sectional view taken in lines III-III in FIG. 1.

FIG. 4 is a sectional view taken in lines IV-IV in FIG. 1.

FIG. 9 is a sectional view of a first variation of the micromirror element in FIG. 1. The view corresponds to FIG. 3 which depicts the micromirror element in FIG. 1.

FIG. 10 is another sectional view of the first variation of the micromirror element in FIG. 1. The view corresponds to FIG. 4 which depicts the micromirror element in FIG. 1.

FIG. 13 is a sectional view of a second variation of the micromirror element in FIG. 1. The view corresponds to FIG. 3 which depicts the micromirror element in FIG. 1.

FIG. 14 is a sectional view of the second variation of the micromirror element in FIG. 1. The view corresponds to FIG. 4 which depicts the micromirror element in FIG. 1.

FIG. 15 shows a few steps in a method of making comb-teeth electrode pair according to a third mode of embodiment of the present invention.

FIG. 19 is a sectional view taken in lines XIX-XIX in FIG. 17.

FIG. 20 is a sectional view taken in lines XX-XX in FIG. 17.

FIG. 26 is a sectional view of a variation of the micromirror element in FIG. 17. The view corresponds to FIG. 19 which depicts the micromirror element in FIG. 17.

FIG. 27 is a sectional view of the variation of the micromirror element in FIG. 17. The view corresponds to FIG. 20 which depicts the micromirror element in FIG. 17.

FIG. 33 shows a few steps in a conventional method of making a micromirror element.

DETAILED DESCRIPTION OF THE PREFERRED EMBODIMENTS

Figure 1:
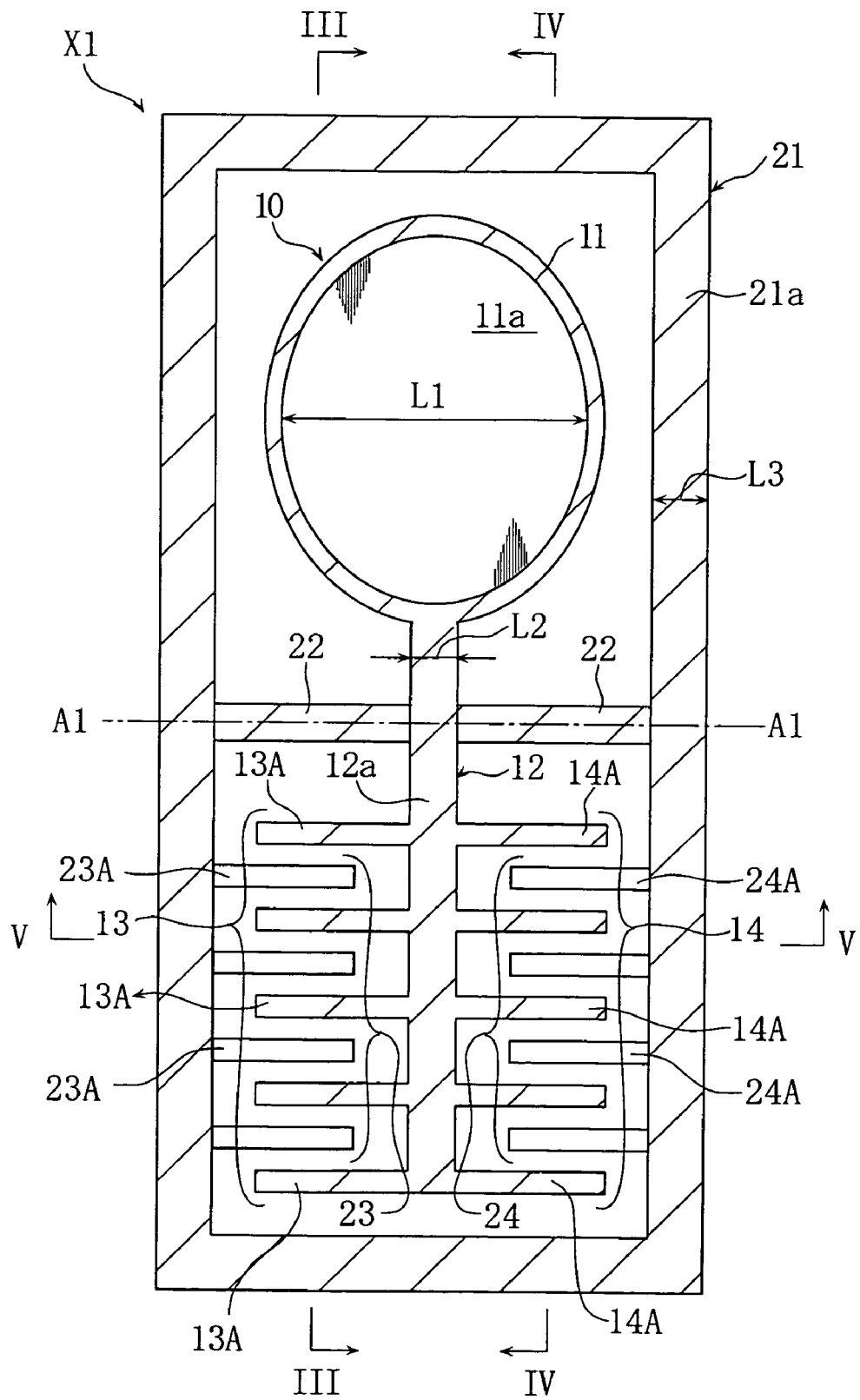
FIG. 1 is a plan view of a micromirror element, in manufacture of which utilization may be made for a method of making comb-teeth electrode pair according to a first mode of embodiment of the present invention.
Figure 2:
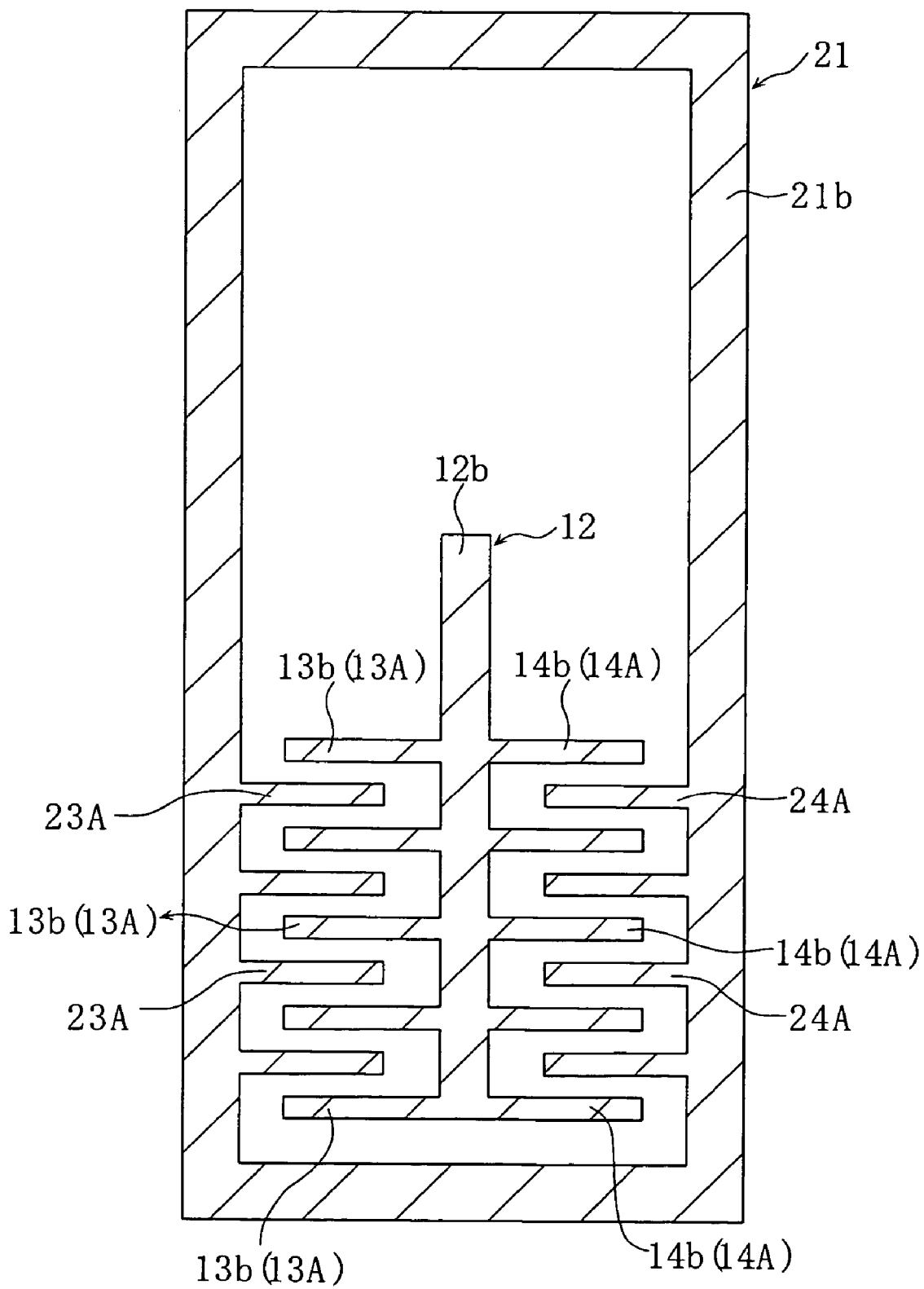
FIG. 2 is a partially non-illustrated plan view of the micromirror element in FIG. 1.
Figure 5:
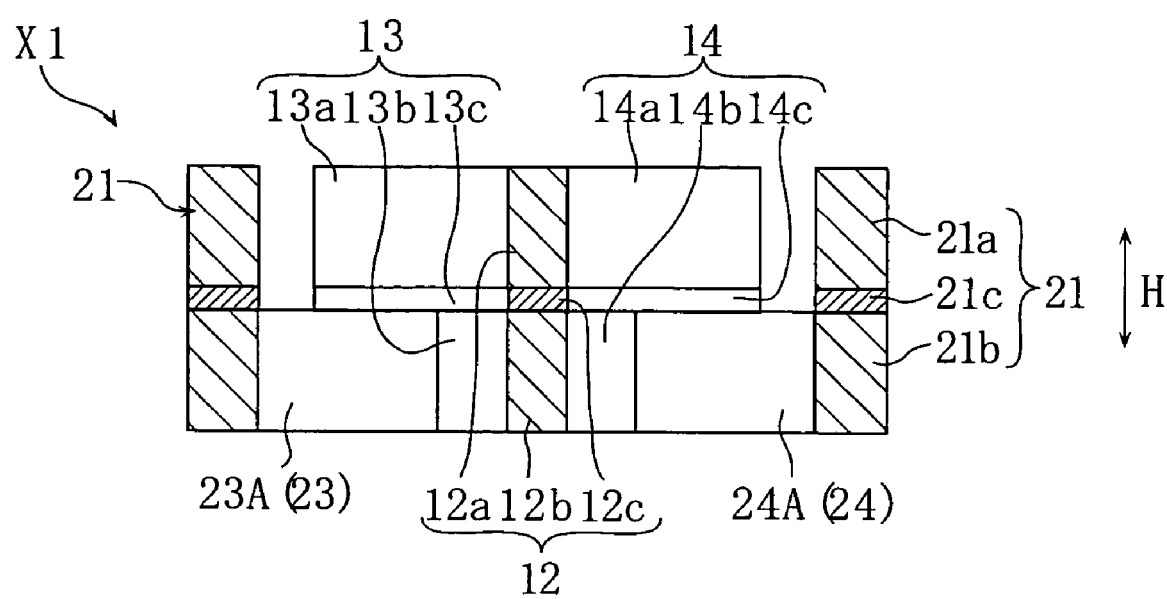
FIG. 5 is a sectional view taken in lines V-V in FIG. 1.

FIG. 1 through FIG. 5 show a micromirror element X1 which can be manufactured by utilizing a method of making comb-teeth electrode pair according to a first mode of embodiment of the present invention. FIG. 1 is a plan view of the micromirror element X1. FIG. 2 is also a plan view of the micromirror element X1 with part thereof non-illustrated, and FIG. 3 through FIG. 5 are sectional views taken in lines III-III, IV-IV, and lines V-V in FIG. 1, respectively.

The micromirror element X1 includes a rocker 10, a frame 21, a pair of torsion bars 22 and comb-teeth electrodes 23, 24, and is manufactured by micromachining technology which is a type of MEMS technology, from a material substrate provided by an SOI (silicon insulator) substrate. The material substrate has a laminate structure composed of a first and a second silicon layers and an insulation layer between the silicon layers. Each silicon layer is doped with impurity, and thereby given a predetermined level of electrical conductivity. Each of the above-mentioned portions in the micromirror element X1 is derived primarily from the first silicon layer and/or the second silicon layer. For the sake of viewing clarity, hatching is made in FIG. 1, to indicate the portion which is derived from the first silicon layer and protruding above the paper surface toward the viewer. FIG. 2 shows a structure derived from the second silicon layer in the micromirror element X1.

The rocker 10 has a mirror support 11, an arm 12, and comb-teeth electrodes 13, 14.

The mirror support 11 is derived from the first silicon layer, and its surface is provided with a mirror surface 11a which is capable of reflecting light. The mirror surface 11a has a laminate structure composed e.g. of a Cr layer formed on the first silicon layer and an Au layer formed thereon. Note that a length L1 of the mirror support 11 in FIG. 1 is 20 through 300 μm for example.

The arm 12, which extends from the mirror support 11 as shown in FIG. 5, has a laminate structure composed of a conductor 12a which is derived from the first silicon layer, a conductor 12b which is derived from the second silicon layer and an insulator 12c which is derived from the insulation layer and is between the conductors 12a, 12b. The conductor 12b is also shown in FIG. 2. When necessary, the arm 12 may have an electrically conductive plug which penetrates the conductor 12a and the insulator 12c for electric connection between the conductors 12a, 12b. Note that a length L2 of the arm 12 in FIG. 1 is 10 through 100 μm for example.

The comb-teeth electrode 13 has a plurality of electrode teeth 13A. Each of the electrode teeth 13A extends from the arm 12, and is spaced from the adjacent ones in a direction the arm 12 extends. As shown in FIG. 3 and FIG. 5, the comb-teeth electrode 13 or each of the electrode teeth 13A has a laminate structure composed of a conductor 13a which is derived from the first silicon layer, a conductor 13b which is derived from the second silicon layer, and an insulator 13c which is derived from the insulation layer and is between conductor 13a, 13b. The conductor 13b is also shown in FIG. 2. These conductors 13a, 13b and the insulator 13c are laminated in oscillating directions of the rocker 10 (in a thickness direction H of the micromirror element X1). As shown in FIG. 1, the conductor 13a is continuous with and electrically connected with the conductor 12a of the arm 12. As shown in FIG. 2, the conductor 13b is continuous with and electrically connected with the conductor 12b of the arm 12. Further, as shown in FIG. 1, the direction in which the electrode teeth 13A extend is perpendicular to the direction in which the arm 12 extends, and as shown in FIG. 3, the electrode teeth 13A are upright in the element's thickness direction H.

The comb-teeth electrode 14 has a plurality of electrode teeth 14A. Each of the electrode teeth 14A extends from the arm 12 on a side away from the electrode teeth 13A, and is spaced from the adjacent ones in a direction the arm 12 extends. As shown in FIG. 4 and FIG. 5, the comb-teeth electrode 14 or each of the electrode teeth 14A has a laminate structure composed of a conductor 14a which is derived from the first silicon layer, a conductor 14b which is derived from the second silicon layer, and an insulator 14c which is derived from the insulation layer and is between conductor 14a, 14b. The conductor 14b is also shown in FIG. 2. These conductors 14a, 14b and the insulator 14c are laminated in oscillating directions of the rocker 10 (in the thickness direction H of the micromirror element X1). As shown in FIG. 1, the conductor 14a is continuous with and electrically connected with the conductor 12a of the arm 12. As shown in FIG. 2, the conductor 14b is continuous with and electrically connected with the conductor 12b of the arm 12. The comb-teeth electrode 14 or the electrode teeth 14A as described is electrically connected with the comb-teeth electrode 13 or the electrode teeth 13A via the arm 12. Further, as shown in FIG. 1, the direction in which the electrode teeth 14A extend is perpendicular to the direction in which the arm 12 extends, and as shown in FIG. 4, the electrode teeth 14A are upright in the element's thickness direction H.

As shown in FIG. 1, the frame 21 surrounds the rocker 10, and as shown in FIG. 3 through FIG. 5, has a laminate structure composed of a conductor 21a which is derived from the first silicon layer, a conductor 21b which is derived from the second silicon layer conductor 21b and insulator 21c which is derived from the insulation layer and is between the conductors 21a, 21b. The conductor 21b is also shown in FIG. 2. Note that a length L3 of the frame 21 in FIG. 1 is 5 through 50 μm for example.

The pair of torsion bars 22, which are primarily derived from the first silicon layer, connects with the conductor 12a of the arm 12 in the rocker 10, as well as with the conductor 21a of the frame 21, thereby connecting these. The torsion bars 22 provide electrical connection between the conductor 12a and the conductor 21a. As shown in FIG. 3 and FIG. 4, each of the torsion bars 22 is thinner than the conductor 12a of the arm 12 in the element's thickness direction H, as well as than the conductor 21a of the frame 21. The torsion bars 22 as described provide an oscillating axis A1 of the rocker 10 or the mirror support 11. As shown in FIG. 1, the oscillating axis A1 is perpendicular to the direction in which the arm 12 extends. Therefore, the electrode teeth 13A, 14A, which extend perpendicularly to the direction in which the arm 12 extends, extend in parallel to the oscillating axis A1. The oscillating axis A1 as the above preferably passes through or near the center of gravity of the rocker 10.

The comb-teeth electrode 23, which works with the comb-teeth electrode 13 to generate static attraction, includes a plurality of electrode teeth 23A. Each of the electrode teeth 23A extends from the frame 21, and is spaced from the adjacent ones in the direction the arm 12 extends. The comb-teeth electrode 23 is primarily derived from the second silicon layer, and as shown in FIG. 2 and FIG. 5, is fixed to the conductor 21b in the frame 21. As shown in FIG. 1, the electrode teeth 23A extend perpendicularly to the direction in which the arm 12 extends, and so the electrode teeth 23A extend in parallel to the oscillating axis A1. Further, as shown in FIG. 3, the electrode teeth 23A are upright in the element's thickness direction H. The comb-teeth electrode 23 and the comb-teeth electrode 13 as described constitute a drive mechanism in the micromirror element X1.

The comb-teeth electrode 24, which works with the comb-teeth electrode 14 to generate static attraction, includes a plurality of electrode teeth 24A. Each of the electrode teeth 24A extends from the frame 21, and is spaced from the adjacent ones in the direction the arm 12 extends. The comb-teeth electrode 24 is primarily derived from the second silicon layer, and as shown in FIG. 2 and FIG. 5, is fixed to the conductor 21b in the frame 21. The comb-teeth electrode 24 or the electrode teeth 24A is electrically connected with the comb-teeth electrode 23 or the electrode teeth 23A via the conductor 21b of the frame 21. As shown in FIG. 1, the electrode teeth 24A extend perpendicularly to the direction in which the arm 12 extends, and so the electrode teeth 24A extend in parallel to the oscillating axis A1. Further, as shown in FIG. 4, the electrode teeth 24A are upright in the element's thickness direction H. The comb-teeth electrode 24 and the comb-teeth electrode 14 as described constitute a drive mechanism in the micromirror element X1.

In the micromirror element X1, by applying a predetermined voltage to the conductor 13a of the comb-teeth electrode 13, conductor 14a of the comb-teeth electrode 14, and the comb-teeth electrodes 23, 24 as required, it is possible to rotationally displace the rocker 10 or the mirror support 11 about the oscillating axis A1. Voltage application to the conductors 13a, 14a of the comb-teeth electrodes 13, 14 can be achieved via the conductor 21a of the frame 21, the torsion bars 22, and the conductor 12a of the arm 12. The conductors 13a, 14a of the comb-teeth electrodes 13, 14 are grounded for example. On the other hand, voltage application to the comb-teeth electrodes 23, 24 can be achieved via the conductor 21b of the frame 21. In the frame 21, the conductor 21a is electrically insulated from the conductor 21b by the insulator 21c.

Figure 6:
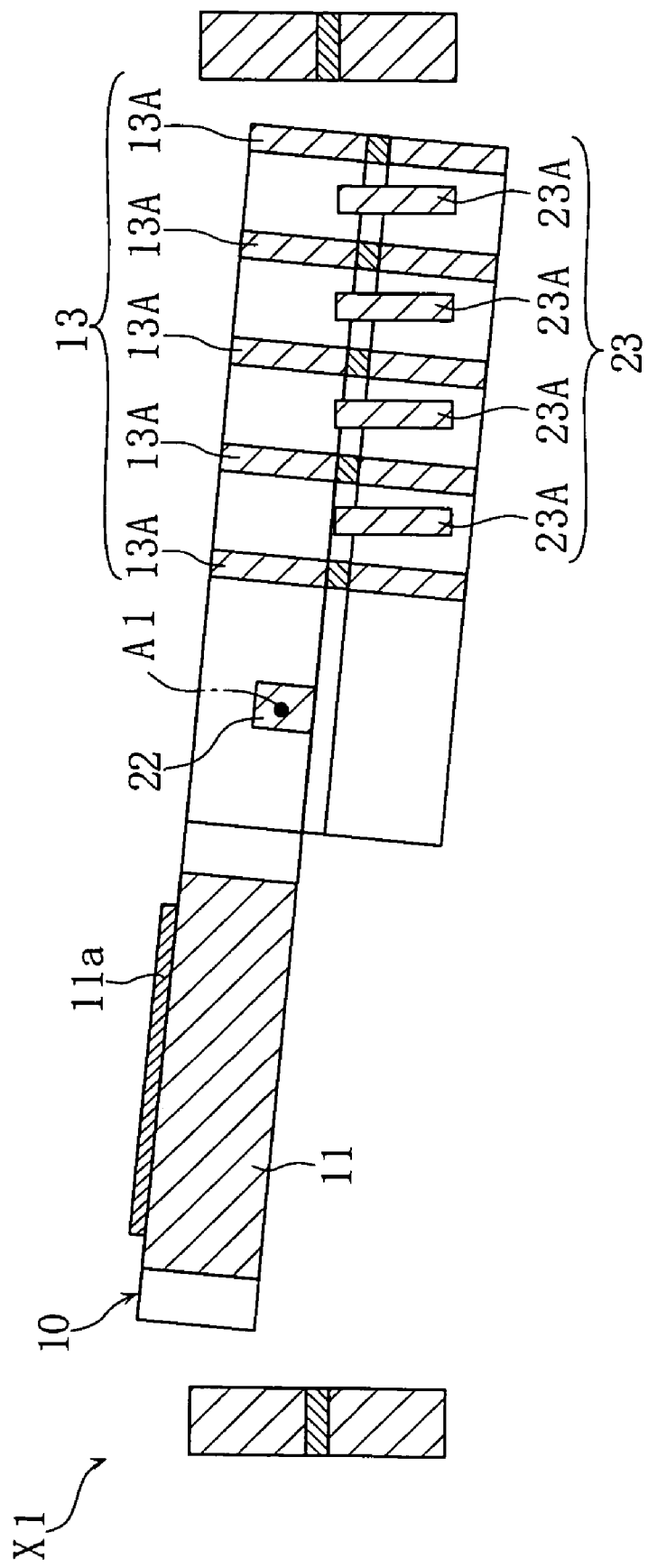
FIG. 6 is a sectional view taken in lines III-III in FIG. 1, showing the micromirror element in operation.

When a desired static electrical attraction is generated between the conductor 13a and the comb-teeth electrode 23 as well as between the conductor 14a and the comb-teeth electrode 24, the conductor 13a is drawn in the comb-teeth electrode 23 whereas the conductor 14a is drawn in the comb-teeth electrode 24. This causes the rocker 10 or the mirror support 11 to pivot about the oscillating axis A1, until the static attraction balances with the sum of torsional resistance forces in the torsion bars 22. In the balanced state, the comb-teeth electrodes 13, 23 assume an orientation as shown e.g. in FIG. 6, and so are the comb-teeth electrodes 14, 24. In the oscillating motion as described, the amount of rotational displacement can be adjusted by adjusting the voltage applied to the conductors 13a, 14a and to the comb-teeth electrodes 23, 24. When the static attraction between the conductor 13a and the comb-teeth electrode 23 as well as the static attraction between the conductor 14a and the comb-teeth electrode 23 is ceased, each of the torsion bars 22 comes back to its natural state, bringing the rocker 10 or the mirror support 11 to an orientation as shown in FIG. 3 through FIG. 5. Using such an oscillating motion of the rocker 10 or the mirror support 11 as described, it is possible to appropriately switch directions in which light is reflected by the mirror surface 11a on the mirror support 11.

Figure 7:
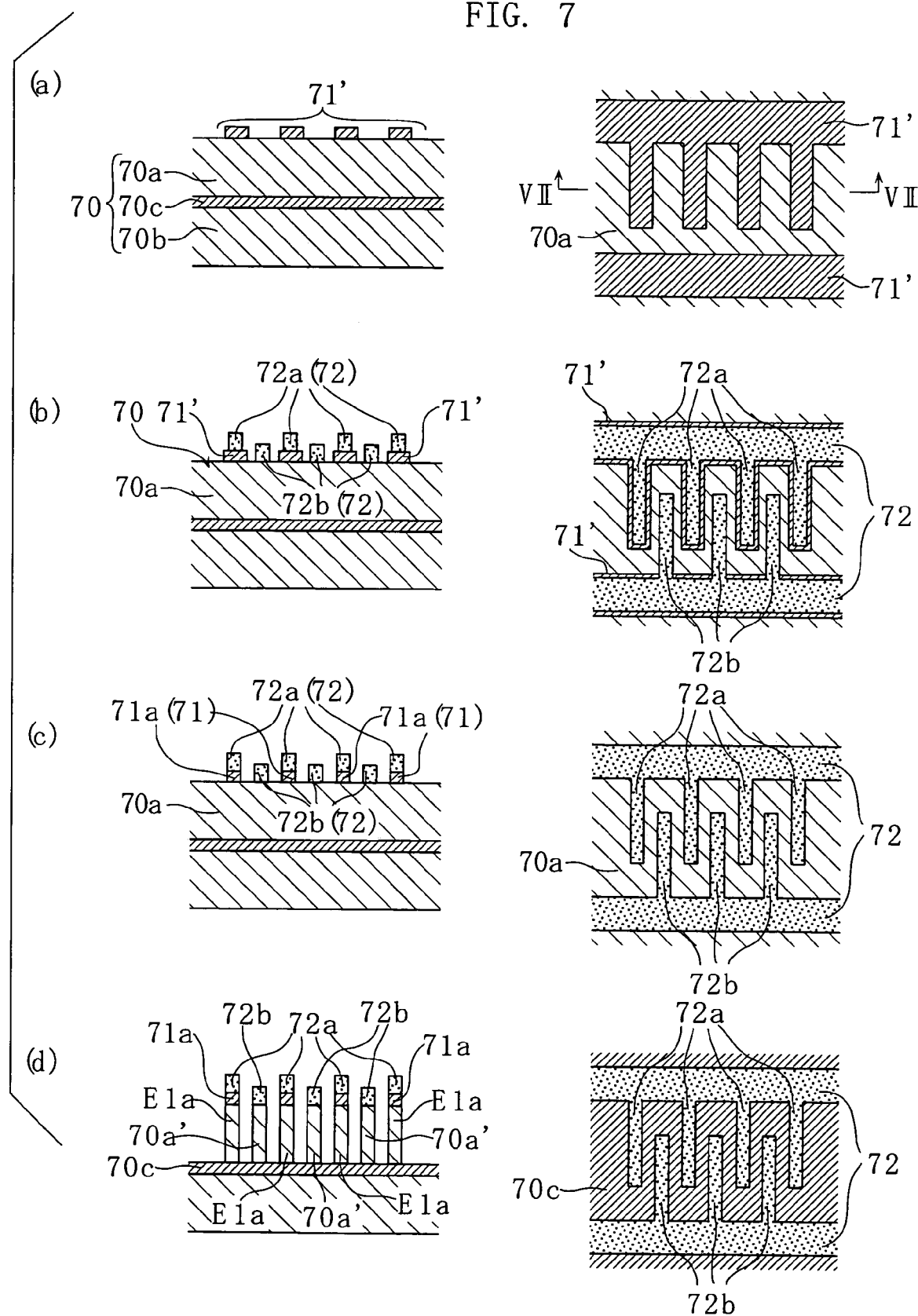
FIG. 7 shows a few steps in a method of making a comb-teeth electrode pair according to a first mode of embodiment of the present invention.
Figure 8:
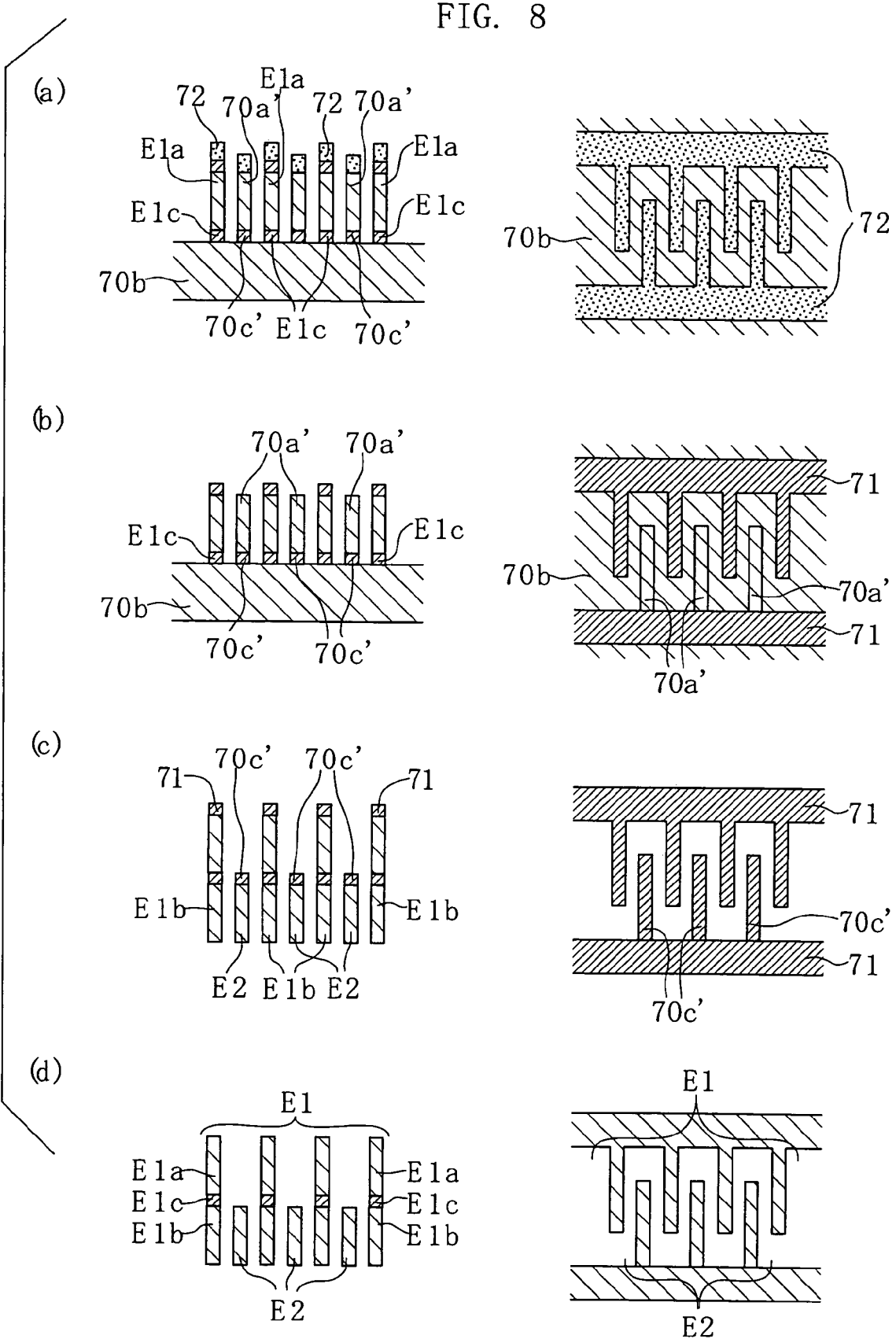
FIG. 8 shows steps following the sequence in FIG. 7.

FIG. 7 and FIG. 8 show a series of steps in the method of making comb-teeth electrode pair according to the first embodiment of the present invention. The method is an example through which formation is made for the pair of comb-teeth electrodes 13, 23 and the pair of comb-teeth electrodes 14, 24, and this method is applicable in a process of manufacturing the micromirror element X1. In FIG. 7 and FIG. 8, views of a section are given on the left-hand side to illustrate a process of forming a pair of comb-teeth electrodes E1, E2 which are illustrated in FIG. 8(d). The section represents a partial section of a material substrate (a wafer having a multi-layer structure) to which micromachining is performed. Likewise, on the right-hand side of FIG. 7 and FIG. 8 are partial plan views of the material substrate to which the micromachining process is performed. Each plan view corresponds to the sectional view on the left. (Each sectional view on the left is one taken in lines VII-VII in the plan view given on the right-hand side in FIG. 7(a). The comb-teeth electrode E1 represents the comb-teeth electrodes 13, 14, and has a laminate structure composed of a conductor E1a, a conductor E1b and an insulator E1c between these. The comb-teeth electrode E2 represents the comb-teeth electrodes 23, 24.

In forming the comb-teeth electrodes E1, E2, first, as shown in FIG. 7(a), a prep oxide film pattern 71' is formed on a material substrate 70. The material substrate 70 is an SOI substrate which has a laminate structure composed of silicon layers 70a, 70b, and an insulation layer 70c between the silicon layers 70a, 70b. The silicon layers 70a, 70b are made of a silicon material which is doped with impurity and thereby rendered conductive. The impurity can be selected from p-type impurities such as B or from n-type impurities such as P and Sb. The insulation layer 70c is provided by silicon oxide for example. The silicon layer 70a has a thickness of e.g. 10 through 100 µm. The silicon layer 70b has a thickness of e.g. 50 through 500 µm. The insulation layer 70c has a thickness of e.g. 0.3 through 3 µm. The prep oxide film pattern 71' is for formation of an oxide film pattern 71 to be described later, and is formed on the silicon layer 70a of the material substrate 70. In forming the prep oxide film pattern 71', first, a film of silicon oxide for example is formed by CVD method, on the surface of the silicon layer 70a to a thickness of 1 µm for example. Next, the oxide film on the silicon layer 70a is patterned by dry etching or wet etching, using a predetermined resist pattern as a mask. If dry etching is used, examples of etching gas include $CF_4$ and $CHF_3$. If wet etching is used, the etchant used in this process may be buffered hydrofluoric acid (BHF) which contains hydrofluoric acid and ammonium fluoride. The oxide film pattern which will be described later is also formed through the same process of oxide film formation, resist pattern formation on the oxide film and an etching process thereafter.

Next, as shown in FIG. 7(b), a resist pattern 72 is formed. The resist pattern 72 includes mask portion 72a on the prep oxide film pattern 71' and mask portion 72b on the silicon layer 70a. The mask portion 72a follows a pattern corresponding to the comb-teeth electrode E1 whereas the mask portion 72b follows a pattern corresponding to the comb-teeth electrode E2. In the formation of the resist pattern 72, first, a liquid photoresist is applied on the side of the silicon layer 70a of the material substrate 70 by spin-coating, from above the prep oxide film pattern 71'. Next, the photo-resist film is patterned through an exposure process and a development process thereafter. Examples of the photo-resist include AZP 4210 (made by AZ Electronic Materials) and AZ 1500 (made by AZ Electronic Materials). Other resist patterns to be described later can also be formed through the same steps of photo-resist film formation, an exposure process and a development process.

Next, as shown in FIG. 7(c), etching is performed to the prep oxide film pattern 71' using the resist pattern 72 as a mask, to form an oxide film pattern 71 which includes a mask portion 71a. The mask portion 71a, which is the portion of the prep oxide film pattern 71' masked by the mask portion 72a of the resist pattern 72, follows virtually the same pattern as the mask portion 72a, and therefore follows the pattern for the comb-teeth electrode E1.

Next, as shown in FIG. 7(d), an anisotropic etching process by DRIE (deep reactive ion etching) is performed to the silicon layer 70a using the oxide film pattern 71 and the resist pattern 72 as masks until the insulation layer 70c is reached. This etching process yields the conductor E1a of the comb-teeth electrode E1 and a remaining mask portion 70a'. The conductor E1a is represented by a portion of the silicon layer 70a masked by a stack of two mask portions 71a, 72a. The remaining mask portion 70a' is a portion of the silicon layer 70a masked by the mask portion 72b. In DRIE, good an isotropic etching is achievable in a Bosch process in which etching and side-wall protection are alternated with each other. The Bosch process may also be used in the present and other DRIE processes to be described later.

Next, as shown in FIG. 8(a), portions of the insulation layer 70c exposed by the previous step is removed by etching. Specifically, an etching process is preformed to the insulation layer 70c from the side on the silicon layer 70a until the silicon layer 70b is reached. The removal can be achieved by dry etching which uses etching gas such as include $CF_4$ and $CHF_3$, or wet etching which uses etchant such as BHF. This etching process yields the insulator E1c of the comb-teeth electrode E1 and a remaining mask portion 70c'. The insulator E1c is represented by the portion of the insulation layer 70c masked by the conductor E1a. The remaining mask portion 70c' is the portion of the insulation layer 70c masked by the remaining mask portion 70a'.

Next, as shown in FIG. 8(b), the resist pattern 72 is removed with e.g. a remover. The remover may be AZ Remover 700 (made by AZ Electronic Materials).

Next, as shown in FIG. 8(c), anisotropic etching by DRIE is performed to the silicon layer 70b from the side on the silicon layer 70a, to remove the remaining mask portion 70a' and form the conductor E1b of the comb-teeth electrodes E1 as well as the comb-teeth electrode E2. The conductor E1b is represented by the portion of the silicon layer 70b contacting the insulator E1c. The comb-teeth electrode E2 is represented by the portion of the silicon layer 70b masked by the remaining mask portion 70c'.

Next, as shown in FIG. 8(d), the oxide film pattern 71 and the remaining mask portion 70c' are removed by etching. The removal can be achieved by dry etching which uses etching gas such as include $CF_4$ and $CHF_3$, or wet etching which uses etchant such as BHF. With the above-described series of steps, it is possible to form a pair of comb-teeth electrodes E1, E2 (a pair of comb-teeth electrodes 13, 23 as well as a pair of comb-teeth electrodes 14, 24).

According to the present method, the mask portions 72a, 72b of the resist pattern 72 are patterned on the same side of the material substrate 70, and therefore it is possible to achieve a high level of accuracy in terms of relative position of formation of the mask-portions 72a, 72b. Further, the mask portion 71a of the oxide film pattern 71 is formed by etching in the step in FIG. 7(c), using the resist pattern 72 as a mask and into a pattern that follows the mask portion 72a of the resist pattern 72. Therefore, according to the present method, it is possible to achieve a high level of accuracy in terms of relative position of formation of the mask portion 71a, 72b. In other words, according to the present method, highly accurate positioning is achieved by self alignment between the mask portion 71a of the oxide film pattern 71 and the mask portion 72b of the resist pattern 72 on the same side of the material substrate 70. (Specifically, positioning of the mask portion 71a with respect to the mask portion 72b is achieved essentially through patterning of the mask portion 71a by the mask portion 72a which are included in the resist pattern 72 together with the mask portion 72b.) Thus, in the step described with reference to FIG. 7(d), the conductor E1a is shaped to follow the shape of the mask portion 71a, and the remaining mask portion 70a' is shaped to follow the shape of the mask portion 72b. Further, in the step described with reference to FIG. 8(a), the insulator E1c is shaped to follow the shape of the conductor E1a (and therefore the mask portion 71a) and the remaining mask portion 70c' is shaped to follow the shape of the remaining mask portion 70a' (and therefore the mask portion 72b). In the step described with reference to FIG. 8(c), the conductor E1b is shaped to follow the shape of the insulator E1c (and therefore the mask portion 71a), and the comb-teeth electrode E2 is shaped to follow the shape of the remaining mask portion 70c' (and therefore the mask portion 72b). Thus, the present method enables to form the comb-teeth electrode E1 which has a laminate structure composed of the conductors E1a, E1b and the insulator E1c, and the comb-teeth electrode E2 at a high level of alignment accuracy.

In addition, the present method enables to achieve high dimensional accuracy of the comb-teeth electrodes E1, E2 in the element's thickness direction. The dimension of the comb-teeth electrode E1 in the element's thickness direction is the thickness of the material substrate 70. The dimension of the comb-teeth electrode E2 in the element's thickness direction is the thickness of the silicon layer 70b of the material substrate 70. Since it is possible to provide highly precise control over the thickness of the material substrate 70 and the thickness of the silicon layer 70b contained therein, it is possible according to the present method to form the comb-teeth electrodes E1, E2 highly accurately in terms of the element's thickness-wise dimensions.

FIG. 9 and FIG. 10 are sectional views of a micromirror element X2 which is a first variation of the micromirror element X1. FIG. 9 and FIG. 10 are sectional views which correspond to FIG. 3 and FIG. 4 for the micromirror element X1 respectively. The micromirror element X2 differs from the micromirror element X1 in that electrode teeth 13A, 14A, 23A, 24A of comb-teeth electrodes 13, 14, 23, 24 incline in a predetermined direction with respect to the thickness direction H when a rocker 10 is in rest.

Figure 11:
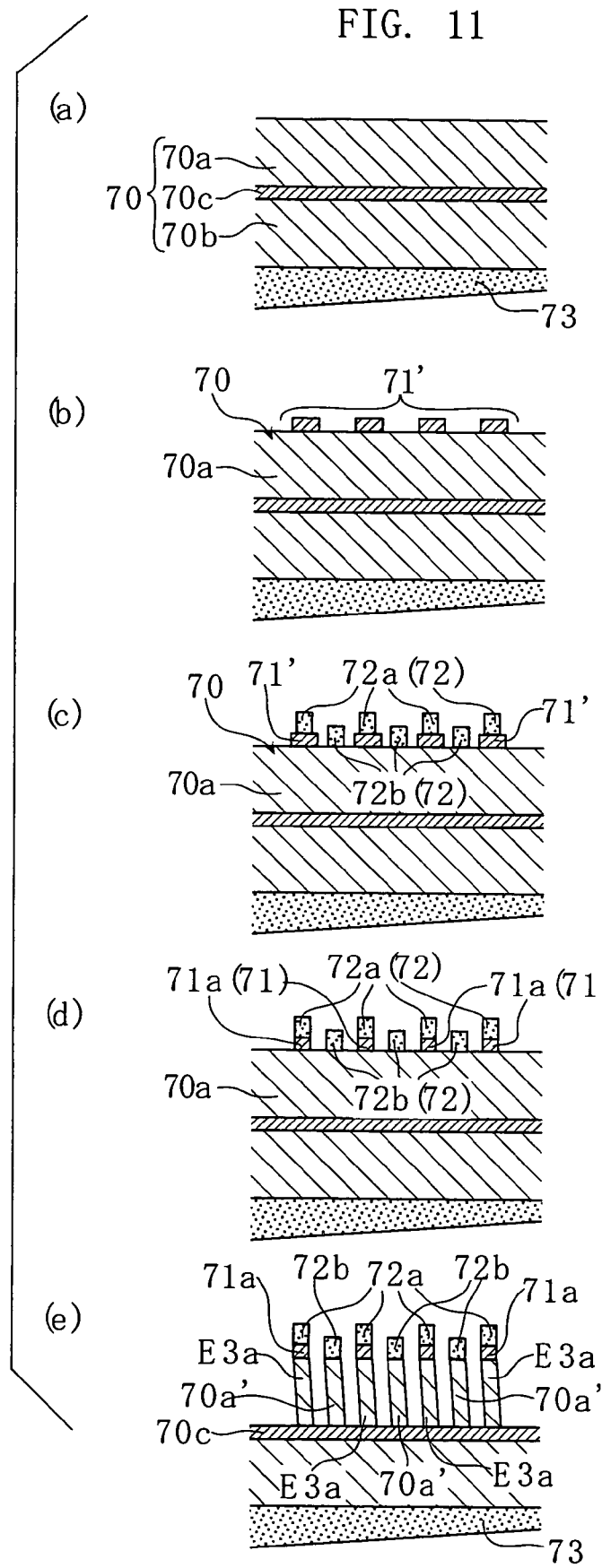
FIG. 11 shows a few steps in a method of making comb-teeth electrode pair according to a second mode of embodiment of the present invention.
Figure 12:
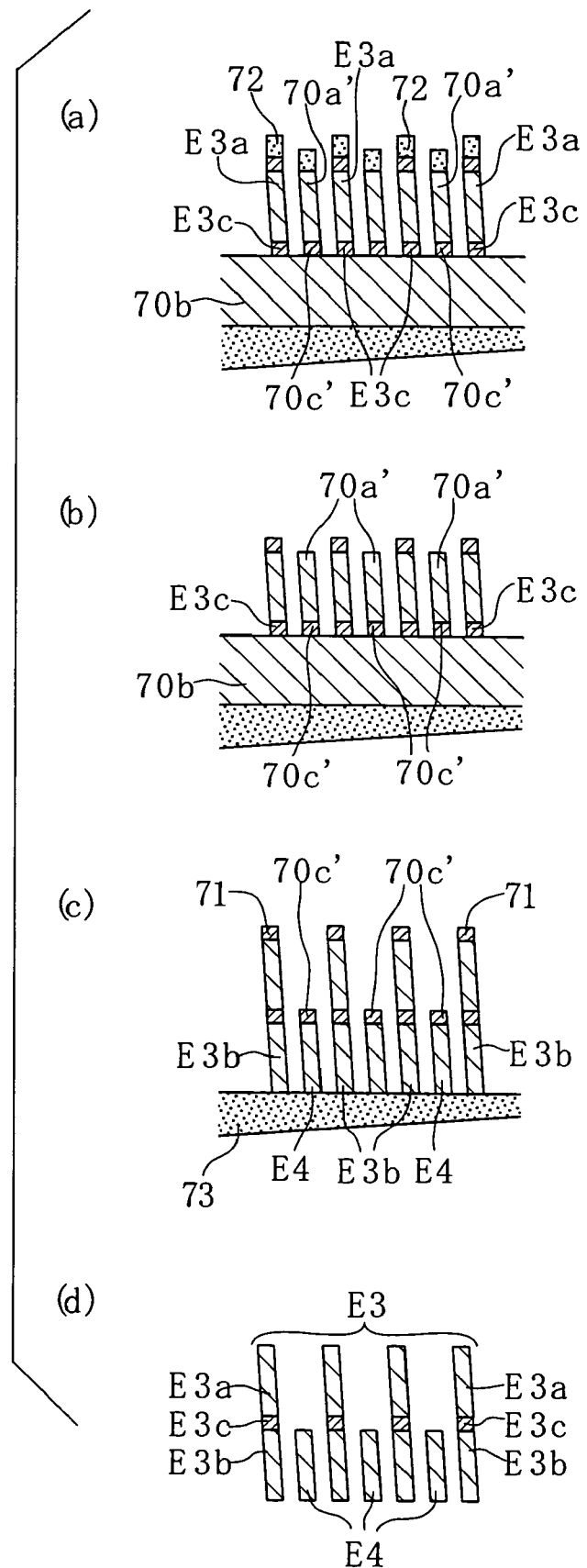
FIG. 12 shows steps following the sequence in FIG. 11.

FIG. 11 and FIG. 12 show a series of steps in the method of making comb-teeth electrode pair according to a second mode of embodiment of the present invention. The method is an example through which formation is made for the pair of comb-teeth electrodes 13, 23 and the pair of comb-teeth electrodes 14, 24 in the micromirror element X2, and this method is applicable in a process of manufacturing the micromirror element X2. In FIG. 11 and FIG. 12, views of a section are given to illustrate a process of forming a pair of electrodes E3, E4 shown in FIG. 12(d). The section represents a partial section of a material substrate (a wafer having a multi-layer structure) to which micromachining is performed. The comb-teeth electrode E3 represents the comb-teeth electrodes 13, 14 of the micromirror element X2, and has a laminate structure composed of a conductor E3a, a conductor E3b and an insulator E3c between these. The comb-teeth electrode E4 represents the comb-teeth electrodes 23, 24 of the micromirror element X2.

In forming the comb-teeth electrodes E3, E4, first, as shown in FIG. 11(a), a resist film 73 is formed on a material substrate 70. The material substrate 70 is the same as in the first embodiment, and thus has a laminate structure composed of electrically conductive silicon layers 70a, 70b, and an insulation layer 70c provided by silicon oxide for example. The resist film 73 is to give a slant to the material substrate 70 in its thickness direction, and has a predetermined thickness gradient, so that the silicon layers 70a, 70b of the material substrate 70 will be etched most quickly at an angle with respect to the thickness direction of the material substrate during the anisotropic etching process to be described later. The angle of slant is 1 through 5 degrees for example. The resist film 73 can be formed as follows for example: First, a liquid photoresist is applied on the silicon layer 70b of the material substrate 70 by spin-coating. Examples of the photoresist include AZP 4210 (made by AZ Electronic Materials) and AZ 1500 (made by AZ Electronic Materials). Next, the photo-resist film is patterned to a predetermined degree through an exposure process using a gray mask which has a predetermined rate of optical transparency. Thereafter, a development process is performed to partially remove the photo-resist film in its thickness direction. In this way, it is possible to form a resist film 73 which has a predetermined thickness gradient.

Thereafter, the comb-teeth electrodes E3, E4 are formed in the same process of micromachining the material substrate 70 as described for the first embodiment with reference to FIG. 7(a) through FIG. 8(d), differing only in that the targets of the formation are comb-teeth electrodes E3, E4, and the process includes a step of removing the resist film 73.

Specifically, first, as shown in FIG. 11(b), a prep oxide film pattern 71' is formed on a silicon layer 70a on a material substrate 70. Next, as shown in FIG. 11(c), a resist pattern 72 is formed which includes a mask portion 72a on the prep oxide film pattern 71' and mask a portion 72b on the silicon layer 70a. In the present embodiment, the mask portion 72a follows a pattern of the comb-teeth electrode E3 whereas the mask portion 72b follows a pattern of the comb-teeth electrode E4. Next, as shown in FIG. 11(d), the prep oxide film pattern 71' is etched, using the resist pattern 72 as a mask, to form an oxide film pattern 71 which includes a mask portion 71a. The mask portion 71a, which is the portion of the prep oxide film pattern 71' masked by the mask portion 72a of the resist pattern 72, follows virtually the same pattern as the mask portion 72a, and therefore follows the pattern for the comb-teeth electrode E3, in the present embodiment.

Next, as shown in FIG. 11(e), anisotropic etching process by DRIE is performed to the silicon layer 70a using the oxide film pattern 71 and the resist pattern 72 as masks until the insulation layer 70c is reached. During this etching process, the material substrate 70 which is placed on the support stage in the etching chamber lies at an angle to the stage surface due to the thickness gradient of the resist film 73. Thus, the direction of etching (the direction in which the etching proceeds at its highest rate) in this etching process is inclined with respect to the thickness direction of the material substrate 70. This etching process yields the conductor E3a of the comb-teeth electrode E3 and a remaining mask portion 70a'. The conductor E3a is represented by the portion of the silicon layer 70a masked by a stack of two mask portion 71a, 72a. The remaining mask portion 70a' is the portion of the silicon layer 70a masked by the mask portion 72b.

Next, as shown in FIG. 12(a), etching is preformed to the insulation layer 70c from the side on the silicon layer 70a until the silicon layer 70b is reached. This etching process yields the insulator E3c of the comb-teeth electrode E3 and a remaining mask portion 70c'. The insulator E3c is represented by the portion of the insulation layer 70c masked by the conductor E3a. The remaining mask portion 70c' is the portion of the insulation layer 70c masked by the remaining mask portion 70a'. Next, as shown in FIG. 12(b), the resist pattern 72 is removed by oxygen ashing for example. Then, as shown in FIG. 12(c), anisotropic etching by DRIE is performed to the silicon layer 70b from the side on the silicon layer 70a, to remove the remaining mask portion 70a' and form the conductor E3b of the comb-teeth electrodes E3 as well as the electrode E4. Again in this etching process, the direction of the etching is inclined with respect to the thickness direction of the material substrate 70, as in the process illustrated in FIG. 11(e) The conductor E3b is represented by the portion of the silicon layer 70b contacting the insulator E3c. The comb-teeth electrode E4 is represented by the portion of the silicon layer 70b masked by the remaining mask portion 70c'. Next, as shown in FIG. 12(d), the oxide film pattern 71 and the remaining mask portion 70c' are removed by etching. Removal is made also for the resist film 73. With the above-described series of steps, it is possible to form a pair of comb-teeth electrodes E3, E4 (a pair of comb-teeth electrodes 13, 23 as well as a pair of comb-teeth electrodes 14, 24) of the micromirror element X2.

The present method enables, as does the first embodiment described above, to achieve a high level of accuracy in relative position of formation of the mask portions 71a, 72b. Specifically, according to the present method, the mask portion 71a of the oxide film pattern 71 and the mask portion 72b of the resist pattern 72 are positioned-highly accurately due to the self alignment on the same side of the material substrate 70. Thus, in the step described with reference to FIG. 11(e), the conductor E3a is shaped to follow the shape of the mask portion 71a, and the remaining mask portion 70a' is shaped to follow the shape of the mask portion 72b. Further, in the step described with reference to FIG. 12(a), the insulator E3c is shaped to follow the shape of the conductor E3a (and therefore the mask portion 71a), and the remaining mask portion 70c' is shaped to follow the shape of the remaining mask portion 70a' (and therefore the mask portion 72b). In the step described with reference to FIG. 12(c), the conductor E3b is shaped to follow the shape of the insulator E3c (and therefore the mask portion 71a), and the comb-teeth electrode E4 is shaped to follow the shape of the remaining mask portion 70c' (and therefore the mask portion 72b). Thus, the present method enables to form the comb-teeth electrode E3 which has a laminate structure composed of the conductors E3a, E3b and the insulator E3c, and the comb-teeth electrode E4 at a high level of alignment accuracy.

In addition, the present method enables to achieve high dimensional accuracy of the comb-teeth electrodes E3, E4 in the element's thickness direction. The dimension of the comb-teeth electrode E3 in the element's thickness direction is the thickness of the material substrate 70. The dimension of the comb-teeth electrode E4 in the element's thickness direction is the thickness of the silicon layer 70b in the material substrate 70. Since it is possible to provide highly precise control over the thickness of material substrate 70 and the thickness of the silicon layer 70b contained therein, it is possible according to the present method to form the comb-teeth electrodes E3, E4 highly accurately in terms of the element's thickness-wise dimensions.

Further, according to the present method, it is possible to form comb-teeth electrodes E3, E4 which are inclined with respect to the element's thickness direction by a predetermined angle, through the use of a resist film 73 which has a predetermined thickness gradient.

FIG. 13 and FIG. 14 are sectional views of a micromirror element X3 which is a second variation of the micromirror element X1. FIG. 13 and FIG. 14 are sectional views which correspond to FIG. 3 and FIG. 4 for the micromirror element X1 respectively. The micromirror element X3 differs from the micromirror element X1 in that conductors 13a, 14a of electrode teeth 13A, 14A or comb-teeth electrodes 13, 14 incline in a predetermined direction with respect to the thickness direction H when a rocker 10 is in rest.

Figure 16:
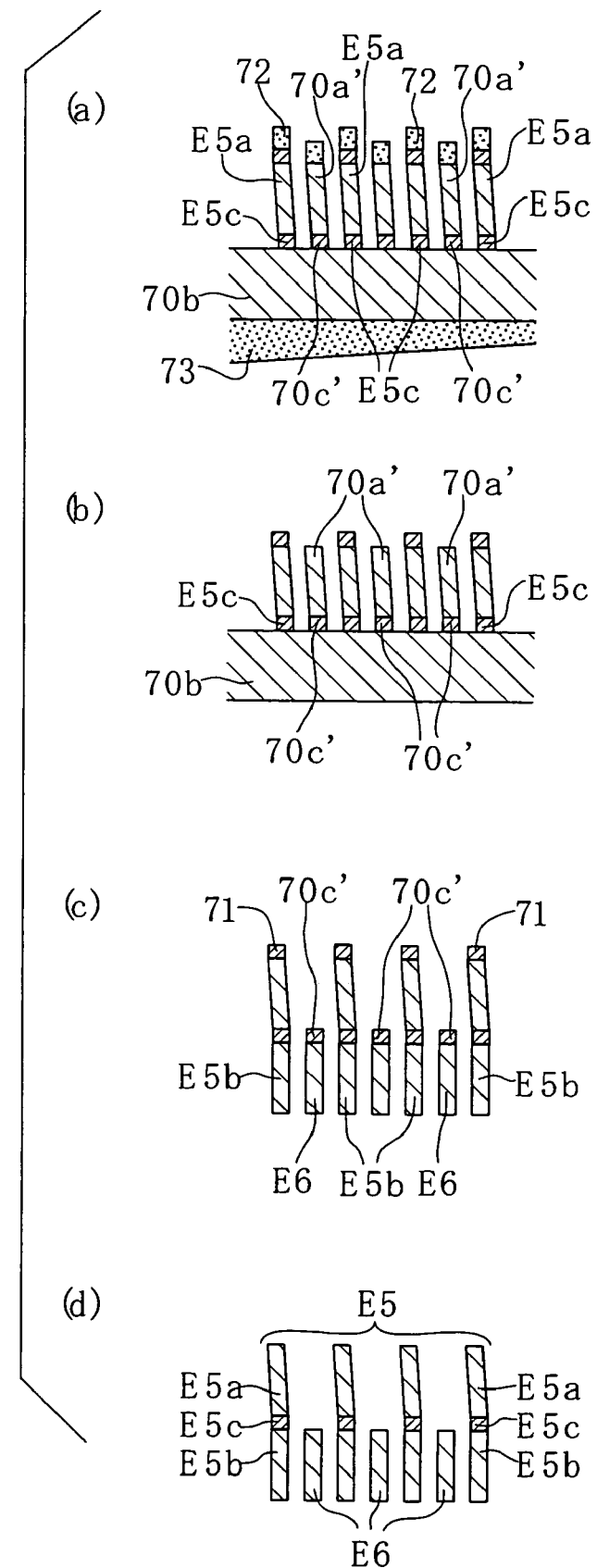
FIG. 16 shows steps following the sequence in FIG. 15.

FIG. 15 and FIG. 16 show a series of steps in the method of making comb-teeth electrode pair according to the third embodiment of the present invention. The method is an example through which formation is made for the pair of comb-teeth electrodes 13, 23 and the pair of comb-teeth electrodes 14, 24 in the micromirror element X3, and this method is applicable in a process of manufacturing the micromirror element X3. In FIG. 15 and FIG. 16, views of a section are given to illustrate a process of forming a pair of electrodes E5, E6. The section represents a partial section of a material substrate (a wafer having a multi-layer structure) to which micromachining is performed. The comb-teeth electrode E5 represents the comb-teeth electrodes 13, 14 of the micromirror element X3, and has a laminate structure composed of a conductor E5a, a conductor E5b and an insulator E5c between these. The comb-teeth electrode E6 represents the comb-teeth electrodes 23, 24 of the micromirror element X3.

In forming the comb-teeth electrodes E5, E6, first, as shown in FIG. 15(a), a resist film 73 is formed on a material substrate 70. The material substrate 70 is the same as in the first embodiment, and thus has a laminate structure composed of electrically conductive silicon layers 70a, 70b, and an insulation layer 70c provided by silicon oxide for example. The resist film 73 is the same as used in the second embodiment, and thus has a predetermined thickness gradient.

Thereafter, the comb-teeth electrodes E5, E6 are formed in the same process of micromachining the material substrate 70 as described for the first embodiment with reference to FIG. 7 through FIG. 8, differing only in that the targets of the formation are the comb-teeth electrodes E5, E6, and the process includes a step of removing the resist film 73.

Specifically, first, as shown in FIG. 15(b), a prep oxide film pattern 71' is formed on a silicon layer 70a on a material substrate 70. Next, as shown in FIG. 15(c), a resist pattern 72 if formed which includes a mask portion 72a on the prep oxide film pattern 71' and a mask portion 72b on the silicon layer 70a. In the present embodiment, the mask portion 72a follows a pattern of the comb-teeth electrode E5 whereas the mask portion 72b follows a pattern of the comb-teeth electrode E6. Next, as shown in FIG. 15(d), the prep oxide film pattern 71' is etched, using the resist pattern 72 as a mask, to form an oxide film pattern 71 which includes a mask portion 71a. The mask portion 71a, which is the portion of the prep oxide film pattern 71' masked by the mask portion 72a of the resist pattern 72, follows virtually the same pattern as the mask portion 72a, and therefore follows the pattern for the comb-teeth electrode E5 in the present embodiment. Next, as shown in FIG. 15(e), anisotropic etching process by DRIE is performed to the silicon layer 70a using the oxide film pattern 71 and the resist pattern 72 as masks until the insulation layer 70c is reached. Again in this etching process, the direction of the etching is inclined with respect to the thickness direction of the material substrate 70, as in the etching process described with reference to FIG. 11(e). This etching process yields the conductor E5a of the comb-teeth electrode E5 and a remaining mask portion 70a'. The conductor E5a is represented by the portion of the silicon layer 70a masked by a stack of two mask portions 71a, 72a. The remaining mask portion 70a' is the portion of the silicon layer 70a masked by the mask portion 72b.

Next, as shown in FIG. 16(a), etching is preformed to the insulation layer 70c from the side on the silicon layer 70a until the silicon layer 70b is reached. This etching process yields the insulator E5c of the comb-teeth electrode E5 and a remaining mask portion 70c'. The insulator E5c is represented by the portion of the insulation layer 70c masked by the conductor E3a. The remaining mask portion 70c' is the portion of the insulation layer 70c masked by the remaining mask portion 70a'. Next, as shown in FIG. 16(b), the resist pattern 72 and the resist film 73 are removed by remover for example. Then, as shown in FIG. 16(c), anisotropic etching by DRIE is performed to the silicon layer 70b from the side on the silicon layer 70a, to remove the remaining mask portion 70a' and form the conductor E5b of the comb-teeth electrodes E5 as well as the electrode E6. The conductor E5b is represented by the portion of the silicon layer 70b contacting the insulator E5c. The comb-teeth electrode E6 is represented by the portion of the silicon layer 70b masked by the remaining mask portion 70c'. Next, as shown in FIG. 16(d), the oxide film pattern 71 and the remaining mask portion 70c' are removed by etching. With the above-described series of steps, it is possible to form a pair of comb-teeth electrodes E5, E6 (a pair of comb-teeth electrodes 13, 23 as well as a pair of comb-teeth electrodes 14, 24 of the micromirror element X3).

The present method enables, as does the first embodiment described above, to achieve a high level of accuracy in relative position of formation of the mask portions 71a, 72b. Specifically, according to the present method, the mask portion 71a of the oxide film pattern 71 and the mask portion 72b of the resist pattern 72 are positioned highly accurately due to the self alignment on the same side of the material substrate 70. Thus, in the step described with reference to FIG. 11(e), the conductor E5a is shaped to follow the shape of the mask portion 71a, and the remaining mask portion 70a' is shaped to follow the shape of the mask portion 72b. Further, in the step described with reference to FIG. 12(a), the insulator E5c is shaped to follow the shape of the conductor E5a (and therefore the mask portion 71a), and the remaining mask portion 70c' is shaped to follow the shape of the remaining mask portion 70a' (and therefore the mask portion 72b). In the step described with reference to FIG. 12(c), the conductor E5b is shaped to follow the shape of the insulator E5c (and therefore the mask portion 71a), and the comb-teeth electrode E6 is shaped to follow the shape of the remaining mask portion 70c' (and therefore the mask portion 72b). Thus, the present method enables to form the comb-teeth electrode E5 which has a laminate structure composed of the conductors E5a, E5b and the insulator E5c, and the comb-teeth electrode E6 at a high level of alignment accuracy.

In addition, the present method enables to achieve high dimensional accuracy of the comb-teeth electrodes E5, E6 in the element's thickness direction. The dimension of the comb-teeth electrode E5 in the element's thickness direction is the thickness of the material substrate 70. The dimension of the comb-teeth electrode E6 in the element's thickness direction is the thickness of the silicon layer 70b in the material substrate 70. Since it is possible to provide highly precise control over the thickness of material substrate 70 and the thickness of the silicon layer 70b contained therein, it is possible according to the present method to form the comb-teeth electrodes E5, E6 highly accurately in terms of the element's thickness-wise dimensions.

Further, according to the present method, it is possible to form a comb-teeth electrode E5 which is inclined with respect to the thickness direction of the material substrate 70 or the element's thickness direction by a predetermined angle, through the use of a resist film 73 which has a predetermined thickness gradient.

Figure 17:
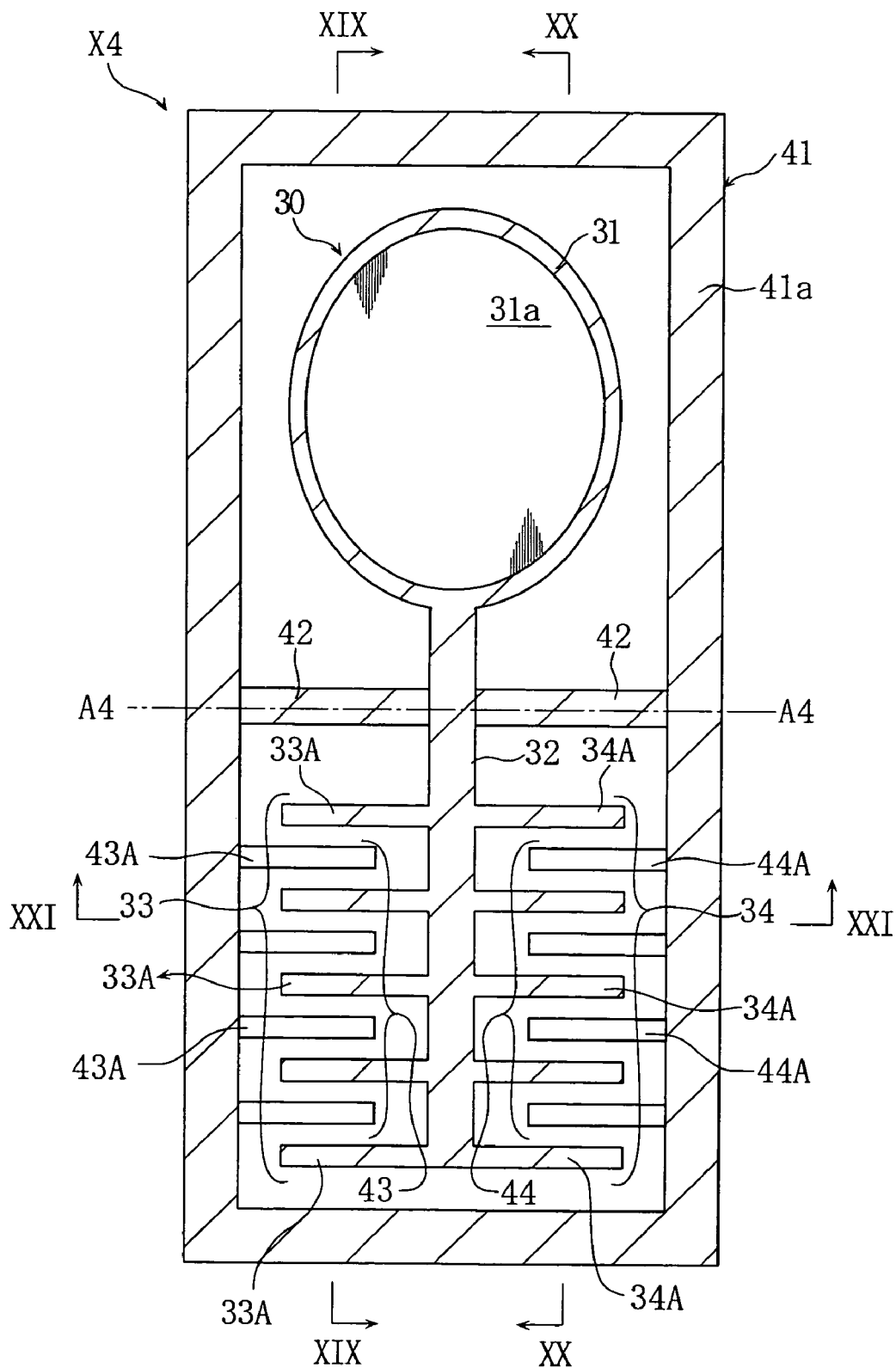
FIG. 17 is a plan view of a micromirror element, in manufacture of which utilization may be made for a method of making comb-teeth electrode pair according to a fourth mode of embodiment of the present invention.
Figure 18:
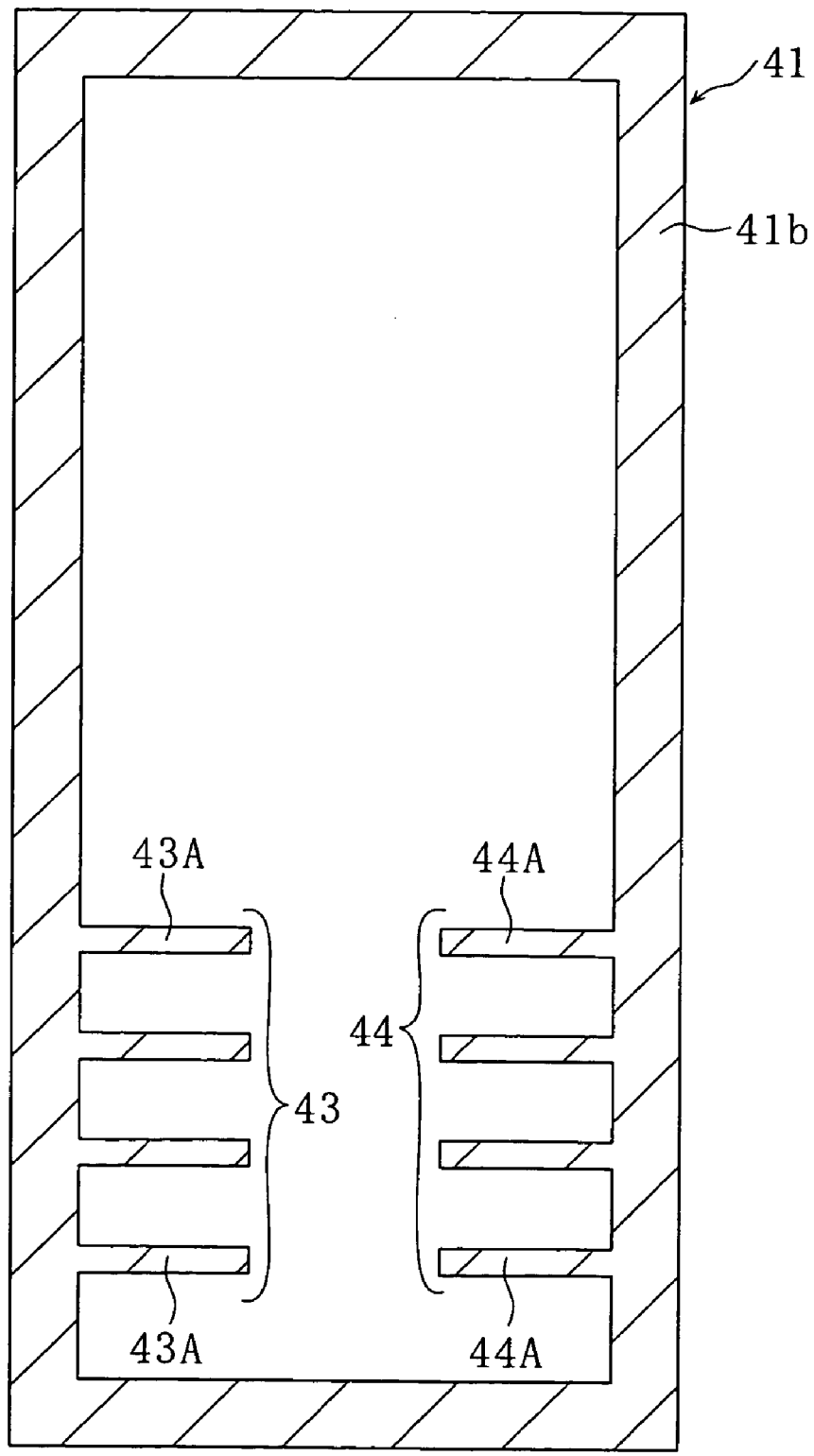
FIG. 18 is a partially non-illustrated plan view of the micromirror element in FIG. 17.
Figure 21:
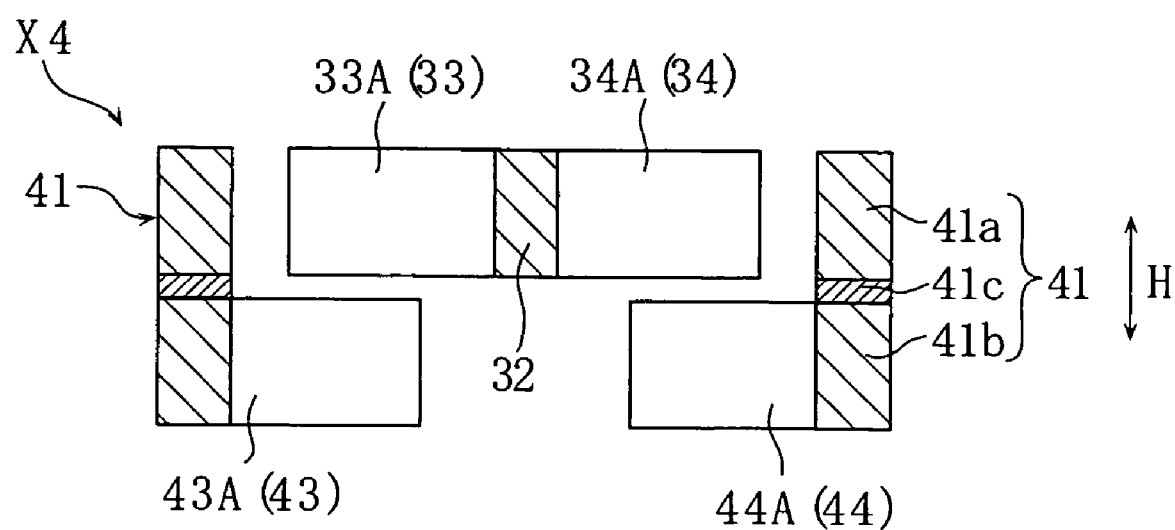
FIG. 21 is a sectional view taken in lines XXI-XXI in FIG. 17.

FIG. 17 through FIG. 21 show a micromirror element X4 which can be manufactured by utilizing a method of making comb-teeth electrode pair according to a fourth mode of embodiment of the present invention. FIG. 17 is a plan view of the micromirror element X4. FIG. 18 is also a plan view of the micromirror element X1 with part thereof non-illustrated. FIG. 19 through FIG. 21 are sectional views taken in lines XIX-XIX, XX-XX, and lines XXI-XXI in FIG. 17, respectively.

The micromirror element X4 includes a rocker 30, a frame 41, a pair of torsion bars 42 and comb-teeth electrodes 43, 44, and is manufactured by micromachining technology which is a type of MEMS technology, from a material substrate provided by an SOI substrate. The material substrate has a laminate structure composed of a first and a second silicon layers and an insulation layer between the silicon layers. Each silicon layer is doped with impurity, and thereby given a predetermined level of electrical conductivity. Each of the above-mentioned portions in the micromirror element X4 is derived primarily from the first silicon layer and/or the second silicon layer. For the sake of viewing clarity, hatching is made in FIG. 18, to indicate the portion which is derived from the first silicon layer and protruding above the insulation layer toward the viewer. FIG. 18 shows a structure derived from the second silicon layer in the micromirror element X4.

The rocker 30 has a mirror support 31, an arm 32, and comb-teeth electrodes 33, 34.

The mirror support 31 is derived from the first silicon layer, and its surface is provided with a mirror surface 31a which is capable of reflecting light. The mirror surface 31a has a laminate structure composed e.g. of a Cr layer formed on the first silicon layer and an Au layer formed thereon. The arm 32 is derived primarily from the first silicon layer, and extends from the mirror support 31.

The comb-teeth electrode 33 has a plurality of electrode teeth 33A. Each of the electrode teeth 33A extends from the arm 32, and is spaced from the adjacent ones in a direction the arm 32 extends. The comb-teeth electrode 34 has a plurality of electrode teeth 34A. Each of the electrode teeth 34A extends from the arm 32 on the side away from the electrode teeth 33A, and is spaced from the adjacent ones in a direction the arm 32 extends. The electrode teeth 33A, 34A are derived primarily from the first silicon layer. In the present embodiment, as shown in FIG. 17, the direction in which the electrode teeth 33A, 34A extend is perpendicular to the direction in which the arm 32 extends, and as shown in FIG. 19, the electrode teeth 33A are upright and in parallel to the element's thickness direction H. As shown in FIG. 20, the electrode teeth 34A are upright and in parallel to the element's thickness direction H. The comb-teeth electrode 33 or the electrode teeth 33A and the comb-teeth electrode 34 or electrode teeth 34A as described are electrically connected with each other via the arm 32.

As shown in FIG. 17, the frame 41 surrounds the rocker 30, and as shown in FIG. 19 through FIG. 21, has a laminate structure composed of a conductor 41a which is derived from the first silicon layer, a conductor 41b which is derived from the second silicon layer and an insulator 41c which is derived from the insulation layer and is between the conductors 41a, 41b. The conductor 41b is also shown in FIG. 18.

The pair of torsion bars 42, which are primarily derived from the first silicon layer, connects with the arm 32 of the rocker 30, as well as with the conductor 41a of the frame 41, thereby connecting these. The torsion bars 42 provide electrical connection between the arm 32 and the conductor 41a. As shown in FIG. 19 and FIG. 20, the torsion bars 42 are thinner than the arm 32 in the element's thickness direction H, as well as than the conductor 41a of the frame 41. The torsion bars 42 as described provide an oscillating axis A4 for the oscillating movement of the rocker 30 or the mirror support 31. As shown in FIG. 1, the oscillating axis A4 is perpendicular to the direction in which the arm 32 extends. Therefore, the electrode teeth 33A, 34A, which extend from the arm 32 perpendicularly to the direction in which the arm 32 extends, are parallel to the oscillating axis A4. The oscillating axis A4 as the above preferably passes through or near the center of gravity of the rocker 30.

The comb-teeth electrode 43, which works with the comb-teeth electrode 33 to generate static attraction, includes a plurality of electrode teeth 43A. Each of the electrode teeth 43A extends from the frame 41, and is spaced from the adjacent ones in the direction the arm 32 extends. The comb-teeth electrode 43 is primarily derived from the second silicon layer, and as shown in FIG. 18, is fixed to the conductor 41b in the frame 41. As shown in FIG. 17, the electrode teeth 43A extend perpendicularly to the direction in which the arm 32 extends, and so the electrode teeth 43A extend in parallel to the oscillating axis A4. Further, as shown in FIG. 19, the electrode teeth 43A are upright in parallel to the element's thickness direction H.

The comb-teeth electrode 43 as described constitutes a drive mechanism together with the comb-teeth electrode 33. As shown in FIG. 19 and FIG. 21, the comb-teeth electrodes 33, 43 are at different height from each other when the rocker 30 is at rest for example. Further, the comb-teeth electrodes 33, 43 have their respective electrode teeth 33A, 43A offset from each other so that they will not hit each other when the rocker 30 makes oscillating motion.

The comb-teeth electrode 44, which works with the comb-teeth electrode 34 to generate static attraction, includes a plurality of electrode teeth 44A. Each of the electrode teeth 44A extends from the frame 41, and is spaced from the adjacent ones in the direction the arm 32 extends. The comb-teeth electrode 44 is primarily derived from the second silicon layer, and as shown in FIG. 18, is fixed to the conductor 41b in the frame 41. The comb-teeth electrode 44 or the electrode teeth 43A is electrically connected with the comb-teeth electrode 43 or the electrode teeth 43A via the conductor 41b of the frame 41. As shown in FIG. 17, the electrode teeth 44A extend perpendicularly to the direction in which the arm 32 extends, and so the electrode teeth 44A extend in parallel to the oscillating axis A4. Further, as shown in FIG. 20, the electrode teeth 44A are upright in parallel to the element's thickness direction H.

The comb-teeth electrode 44 as described constitutes a drive mechanism together with the comb-teeth electrode 34. As shown in FIG. 20 and FIG. 21, the comb-teeth electrodes 34, 44 are at different height from each other when the rocker 30 is at rest for example. Further, the comb-teeth electrodes 34, 44 have their respective electrode teeth 34A, 44A offset from each other so that they will not hit each other when the rocker 30 makes oscillating motion.

In the micromirror element X4, by applying a predetermined voltage to the comb-teeth electrodes 33, 34, 43, 44 as required, it is possible to rotationally displace the rocker 30 or the mirror support 31 about the oscillating axis A4. Voltage application to the comb-teeth electrodes 33, 34 can be achieved via the conductor 41a of the frame 41, the torsion bars 42, and the arm 32. The comb-teeth electrodes 33, 34 are grounded for example. On the other hand, voltage application to the comb-teeth electrodes 43, 44 can be achieved via the conductor 41b of the frame 41. In the frame 41, the conductor 41a is electrically insulated from the conductor 41b by the insulator 41c.

Figure 22:
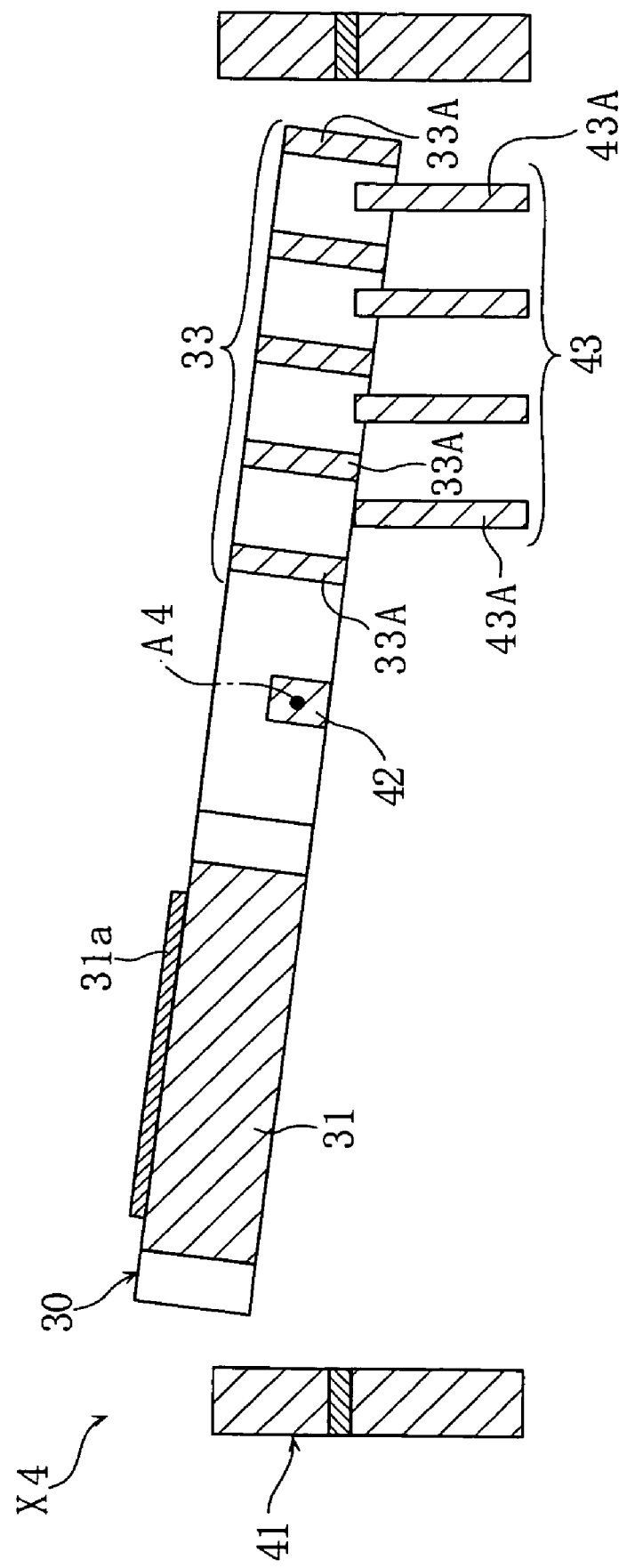
FIG. 22 is a sectional view taken in lines XIX-XIX in FIG. 17, showing the micromirror element in operation.

When a desired static electrical attraction is generated between the comb-teeth electrodes 33, 43 as well as between the comb-teeth electrodes 34, 44, comb-teeth electrode 33 is drawn in the comb-teeth electrode 43 whereas the comb-teeth electrode 34 is drawn in the comb-teeth electrode 44. This causes the rocker 30 or the mirror support 31 to pivot about the oscillating axis A4, until the static attraction balances with the sum of torsional resistance forces in the torsion bars 42. In the balanced state, the comb-teeth electrodes 33, 43 assume an orientation as shown e.g. in FIG. 22, and so are the comb-teeth electrodes 34, 44. In the oscillating motion as described, the amount of rotational displacement can be adjusted by adjusting the voltage applied to the comb-teeth electrodes 33, 34, 43, 44. When the static attraction between the comb-teeth electrode 33, 43 as well as the static attraction between the comb-teeth electrodes 34, 44 is ceased, each of the torsion bars 42 comes back to its natural state, bringing the rocker 30 or the mirror support 31 to an orientation as shown in FIG. 19 through FIG. 21. By utilizing such an oscillating motion of the rocker 30 or the mirror support 31 as described, it is possible to appropriately switch directions in which light is reflected by the mirror surface 31a on the mirror support 31.

Figure 23:
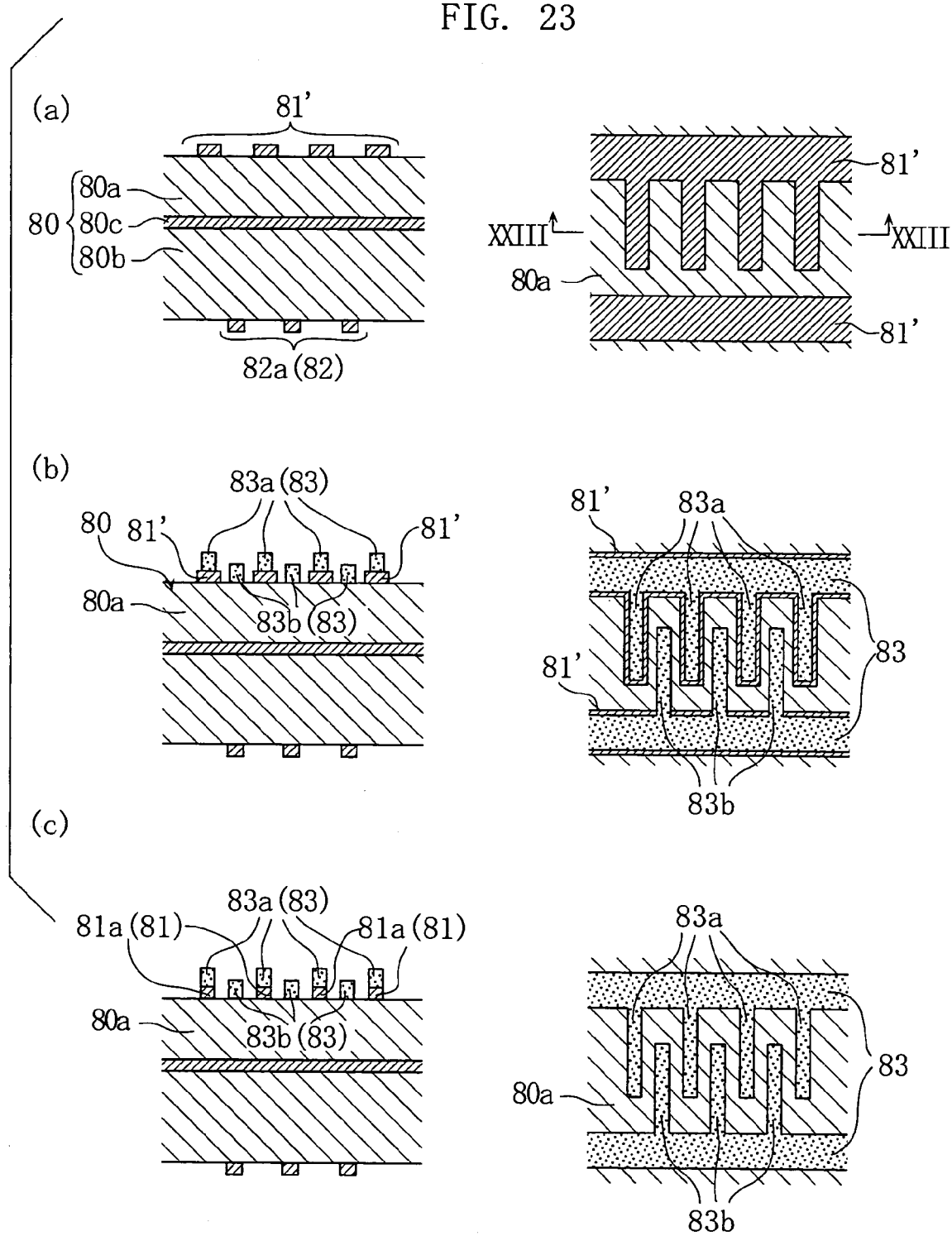
FIG. 23 shows a few steps in a method of making a comb-teeth electrode pair according to a fourth mode of embodiment of the present invention.
Figure 24:
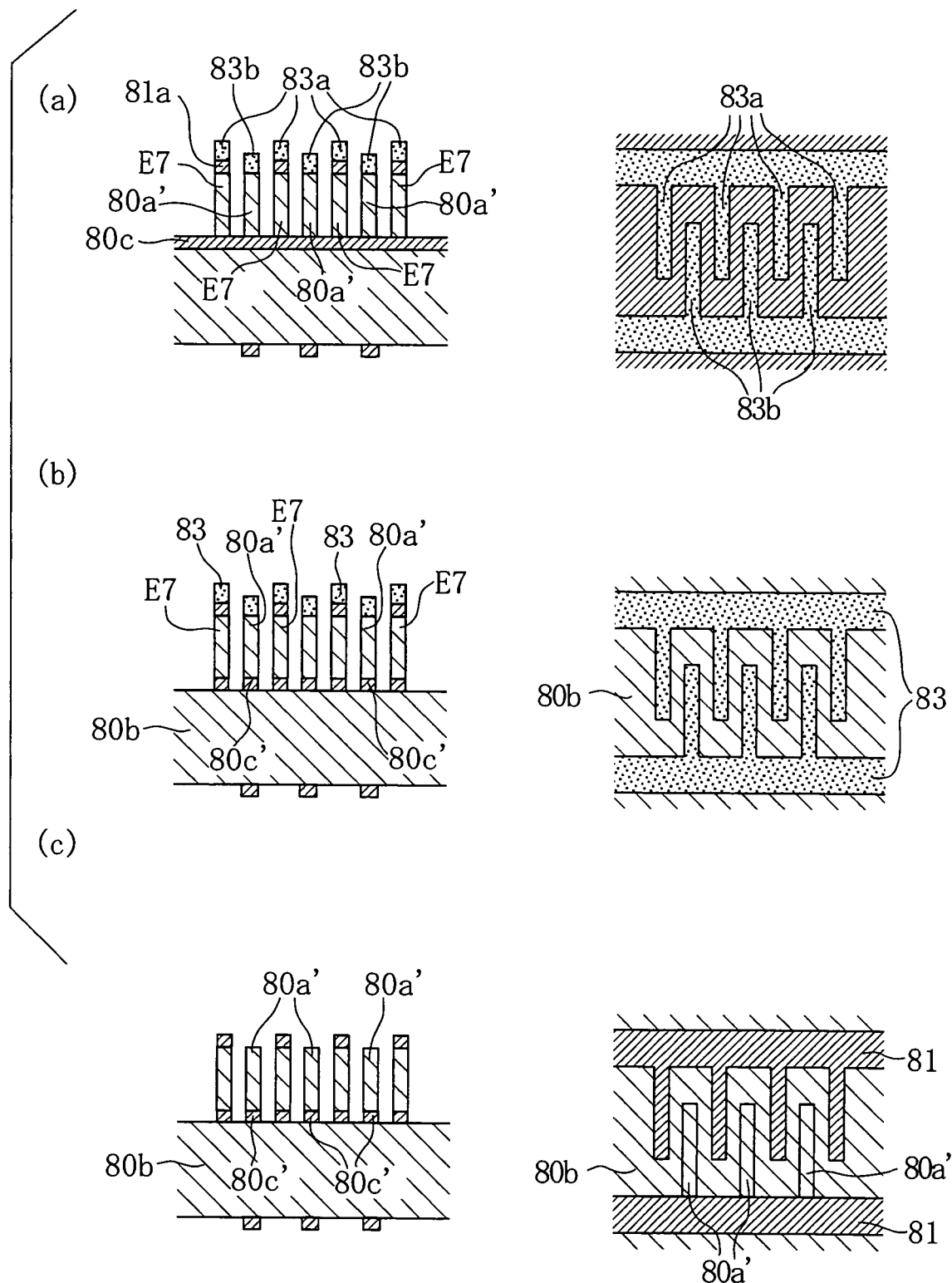
FIG. 24 shows steps following the sequence in FIG. 23.
Figure 25:
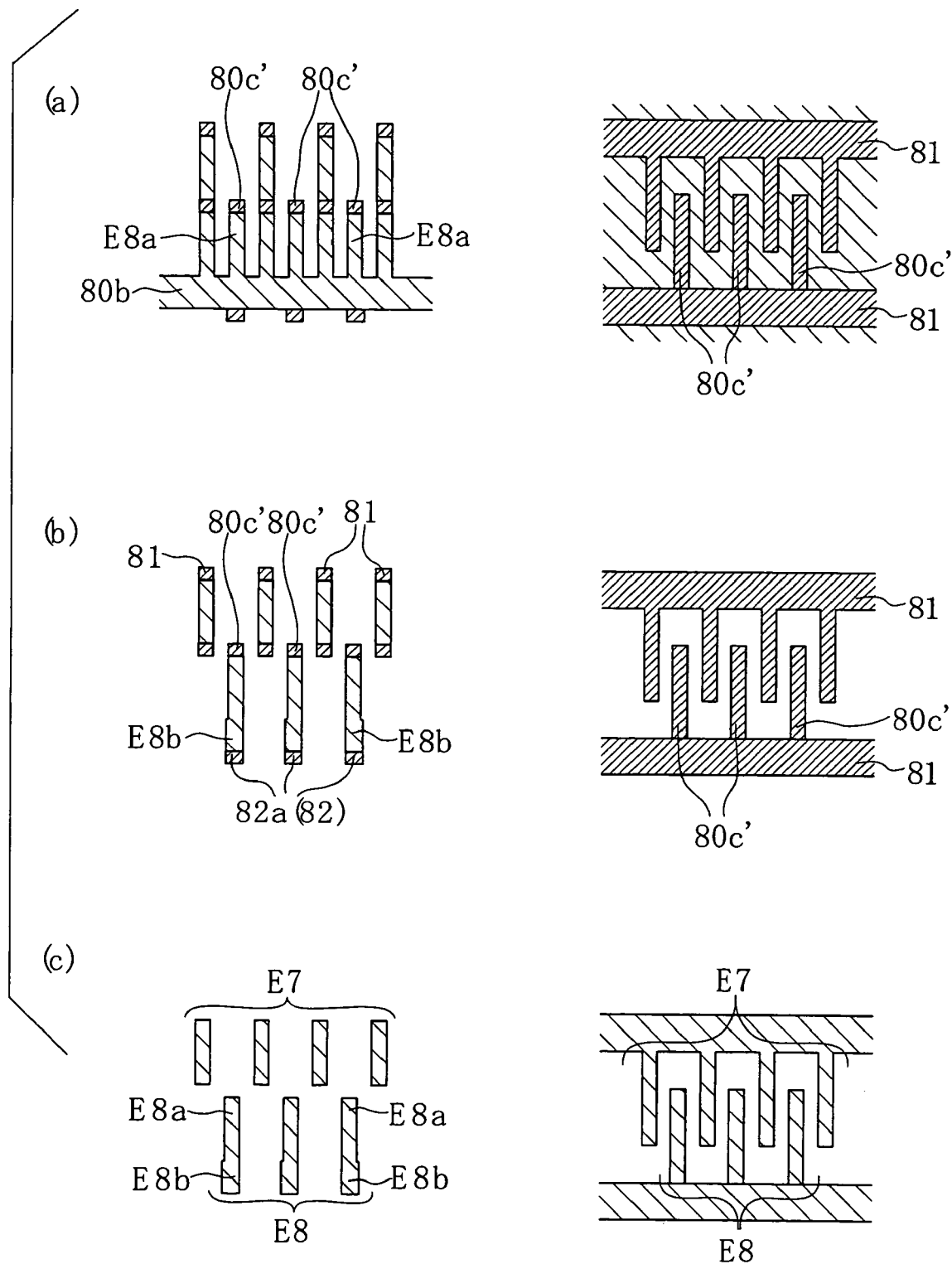
FIG. 25 shows steps following the sequence in FIG. 24.

FIG. 23 through FIG. 25 show a series of steps in the method of making comb-teeth electrode pair according to the fourth mode of embodiment of the present invention. The method is an example through which formation is made for the pair of comb-teeth electrodes 33, 43 and the pair of comb-teeth electrodes 34, 44, and this method is applicable in a process of manufacturing the micromirror element X4. In FIG. 23 and FIG. 24, views of a section are given on the left-hand side to illustrate a process of forming a pair of comb-teeth electrodes E7, E8 which are shown in FIG. 25(c). The section represents a partial section of a material substrate (a wafer having a multi-layer structure) to which micromachining is performed. Likewise, on the right-hand side of FIG. 23 through FIG. 25 are partial plan views of the material substrate to which the micromachining process is performed. Each plan view corresponds to the sectional view on the left. (Each sectional view on the left is one taken in lines XXIII-XXIII in the plan view illustrated on the right-hand side in FIG. 23(a). The comb-teeth electrode E7 represents the comb-teeth electrodes 33, 44. The comb-teeth electrode E8 represents the comb-teeth electrodes 43, 44.

In forming the comb-teeth electrodes E7, E8, first, as shown in FIG. 23(a), a prep oxide film pattern 81' and an oxide film pattern 82 are formed on a material substrate 80. The material substrate 80 is an SOI substrate which has a laminate structure composed of silicon layers 80a, 80b, and an insulation layer 80c between the silicon layers 80a, 80b. The silicon layers 80a, 80b are made of a silicon material which is doped with impurity and thereby rendered conductive. The insulation layer 80c is provided by silicon oxide for example. The silicon layer 80a has a thickness of e.g. 10 through 100 μm. The silicon layer 80b has a thickness greater than that of the silicon layer 80a and within a range of e.g. 50 through 500 μm. The insulation layer 80c has a thickness of e.g. 0.3 through 3 μm. The prep oxide film pattern 81' is for formation of an oxide film pattern 81 to be described later, and is formed on the silicon layer 80a of the material substrate 80. The oxide film pattern 82 includes a mask portion 82a which follows the pattern of comb-teeth electrode E8. In this step, a public method of positioning is used when patterning the oxide film pattern 82 with respect to the prep oxide film pattern 81'.

Next, as shown in FIG. 23(b), a resist pattern 83 is formed. The resist pattern 83 includes a mask portion 83a on the prep oxide film pattern 81' and a mask portion 83b on the silicon layer 80a. The mask portion 83a follows the pattern of the comb-teeth electrode E7 whereas the mask portion 83b follows the pattern of the comb-teeth electrode E8.

Next, as shown in FIG. 23(c), etching is performed to the prep oxide film pattern 81' using the resist pattern 83 as a mask, to form an oxide film pattern 81 which includes a mask portion 81a. The mask portion 81a, which is the portion of the prep oxide film pattern 81' masked by the mask portion 83a of the resist pattern 83, follows virtually the same pattern as the mask portion 83a, and therefore follows the pattern for the comb-teeth electrode E7.

Next, as shown in FIG. 24(a), anisotropic etching process by DRIE is performed to the silicon layer 80a using the oxide film pattern 81 and the resist pattern 83 as masks until the insulation layer 80c is reached. This etching process yields the comb-teeth electrode E7 and a remaining mask portion 80a'. The comb-teeth electrode E7 is represented by the portion of the silicon layer 80a masked by a stack of two mask portions 81a, 83a. The remaining mask portion 80a' is the portion of the silicon layer 80a masked by the mask portion 83b.

Next, as shown in FIG. 24(b), portions of the insulation layer 80c exposed by the previous step is removed by etching. Specifically, an etching process is preformed to the insulation layer 80c from the side on the silicon layer 80a until the silicon layer 80b is reached. The removal can be achieved by dry etching which uses etching gas such as $CF_4$ and $CHF_3$ or by wet etching which uses an etchant such as BHF. This etching process yields a remaining mask portion 80c'. The remaining mask portion 80c' is the portion of the insulation layer 80c masked by the remaining mask portion 80a'. Note that this etching does not remove portions of the insulation layer 80c which make contact with the comb-teeth electrode E7.

Next, as shown in FIG. 24(c), the resist pattern 83 is removed with a remover. The remover may be AZ Remover 700(made by AZ Electronic Materials).

Next, as shown in FIG. 25(a), anisotropic etching by DRIE is performed to the silicon layer 80b from the side on the silicon layer 80a, to remove the remaining mask portion 80a' and form a part E8a of the comb-teeth electrode E8. The part E8a is a portion of the silicon layer 80b which was masked by the remaining mask portion 80c'. Note that this etching does not remove portions of the silicon layer 80b which are below the comb-teeth electrode E7 in the figure.

Next, as shown in FIG. 25(b), anisotropic etching by DRIE is performed to the silicon layer 80b from the side on the oxide film pattern 82, to form the remaining part E8b of the comb-teeth electrodes E8 as well as to remove the remaining portion of the silicon layer 80b which are below the comb-teeth electrode E7 in the figure. The part E8b of the comb-teeth electrode E8 is a portion of the silicon layer 80b masked by the mask portion 82a of the oxide film pattern 82.

Next, as shown in FIG. 25(c), the oxide film patterns 81, 82, the remaining mask portion 80c' and portions derived from the insulation layer 80c which remains below the electrode E7 are removed by etching. The removal can be achieved by dry etching which uses etching gas such as include $CF_4$ and $CHF_3$, or wet etching which uses etchant such as BHF. With the above-described series of steps, it is possible to form a pair of comb-teeth electrodes E7, E8 (a pair of comb-teeth electrodes 33, 43 as well as a pair of comb-teeth electrodes 34, 44).

According to the present method, the mask portions 83a, 83b of the resist pattern 83 are patterned on the same side of the material substrate 80, and therefore it is possible to achieve a high level of accuracy in terms of relative position of formation of the mask portions 83a, 83b. Further, the mask portion 81a of the oxide film pattern 81 are formed by etching in the step in FIG. 23(c), using the resist pattern 83 as a mask and into a pattern that follows the mask portion 83a of the resist pattern 83. Therefore, according to the present method, it is possible to achieve a high level of accuracy in terms of relative position of formation of the mask portion 81a, 83b. In other words, according to the present method, highly accurate positioning is achieved by self alignment between the mask patterns 81a of the oxide film pattern 81 and the mask portion 83b of the resist pattern 83 on the same side of the material substrate 80. (Specifically, positioning of the mask portion 81a with respect to the mask portion 83b is achieved essentially through patterning of the mask portion 81a by the mask portion 83a which is included in the resist pattern 82 together with the mask portion 83b. Thus, in the step described with reference to FIG. 24(a), the comb-teeth electrode E7 is shaped to follow the shape of the mask portion 81a, and the remaining mask portion 80a' is shaped to follow the shape of the mask portion 83b. Further, in the step described with reference to FIG. 24(b), the remaining mask portion 80c' is shaped to follow the shape of the remaining mask portion 80a' (and therefore the mask portion 83a). In the step described with reference to FIG. 25(a), the part E8a of the comb-teeth electrode E8 (part of the comb-teeth electrode E8 closer to the comb-teeth electrode E7) is shaped to follow the shape of the remaining mask portion 80c' (and therefore the mask portion 83b). Thus, the present method enables to form the comb-teeth electrode E7 and the part E8a of the comb-teeth electrode E8 at a high level of alignment accuracy. According to the present method, the remaining part E8b of the comb-teeth electrode E8 (the portion of the comb-teeth electrode E8 which are farther from the comb-teeth electrodes E7) is formed by etching in the step described with reference to FIG. 25(b), using the mask portion 82a of the oxide film pattern 82 as masks, and it is difficult to form the part E8b as precisely as the part E8a, in terms of positional accuracy with respect to the comb-teeth electrodes E7. However, there are cases in which formation position of the part E8b with respect to the comb-teeth electrodes E7 may not be as accurate as are formation position of the part E8a with respect to the comb-teeth electrodes E7. In such a case, the present method enables to form a pair of comb-teeth electrodes E7, E8 at a practically high level of alignment accuracy in terms of relative position of formation.

In addition, the present method enables to achieve high dimensional accuracy of the comb-teeth electrodes E7, E8 in the element's thickness direction. The dimension of the comb-teeth electrode E7 in the element's thickness direction is the thickness of the silicon layer 80a of the material substrate 80. The dimension of the comb-teeth electrode E8 in the element's thickness direction is the thickness of the silicon layer 80b of the material substrate 80. Since it is possible to provide highly precise control over the thickness of silicon layers 80a, 80b, it is possible according to the present method to form the comb-teeth electrodes E7, E8 highly accurately in terms of the element's thickness-wise dimensions.

FIG. 26 and FIG. 27 are sectional views of a micromirror element X5 which is a variation of the micromirror element X4. FIG. 26 and FIG. 26 are sectional views which correspond to FIG. 19 and FIG. 20 for the micromirror element X4 respectively. The micromirror element X5 differs from the micromirror element X4 in that electrode teeth 33A, 34A of comb-teeth electrodes 33, 44 incline in a predetermined direction with respect to the thickness direction H when a rocker 30 is in rest.

In the micromirror element X5, a rocker 30 makes a rotational displacement and causes electrode teeth 33A of a comb-teeth electrode 33 to partially face electrode teeth 43A of a comb-teeth electrode 43, whereupon the electrode teeth 33A can become or nearly become parallel to the electrode teeth 43A. Likewise, as the rocker 30 makes a rotational displacement and causes electrode teeth 34A of a comb-teeth electrode 34 to partially face electrode teeth 44A of a comb-teeth electrode 44, the electrode teeth 34A can become or nearly become parallel to the electrode teeth 44A. Therefore, it is easy in the micromirror element X5 to provide control for stable static attraction between the comb-teeth electrodes 33 and 43, as well as between the comb-teeth electrodes 34 and 44.

Figure 28:
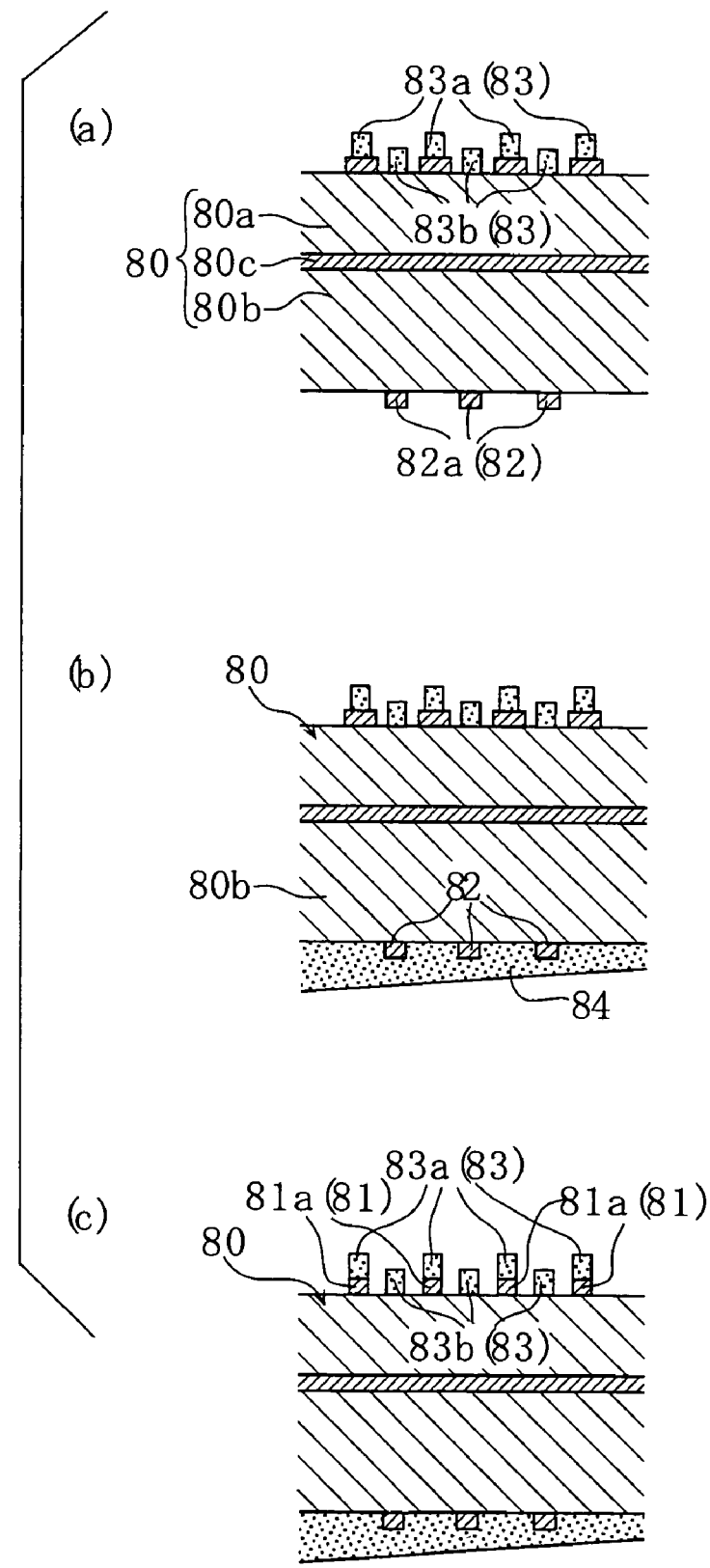
FIG. 28 shows a few steps in a method of making comb-teeth electrode pair according to a fifth mode of embodiment of the present invention.
Figure 29:
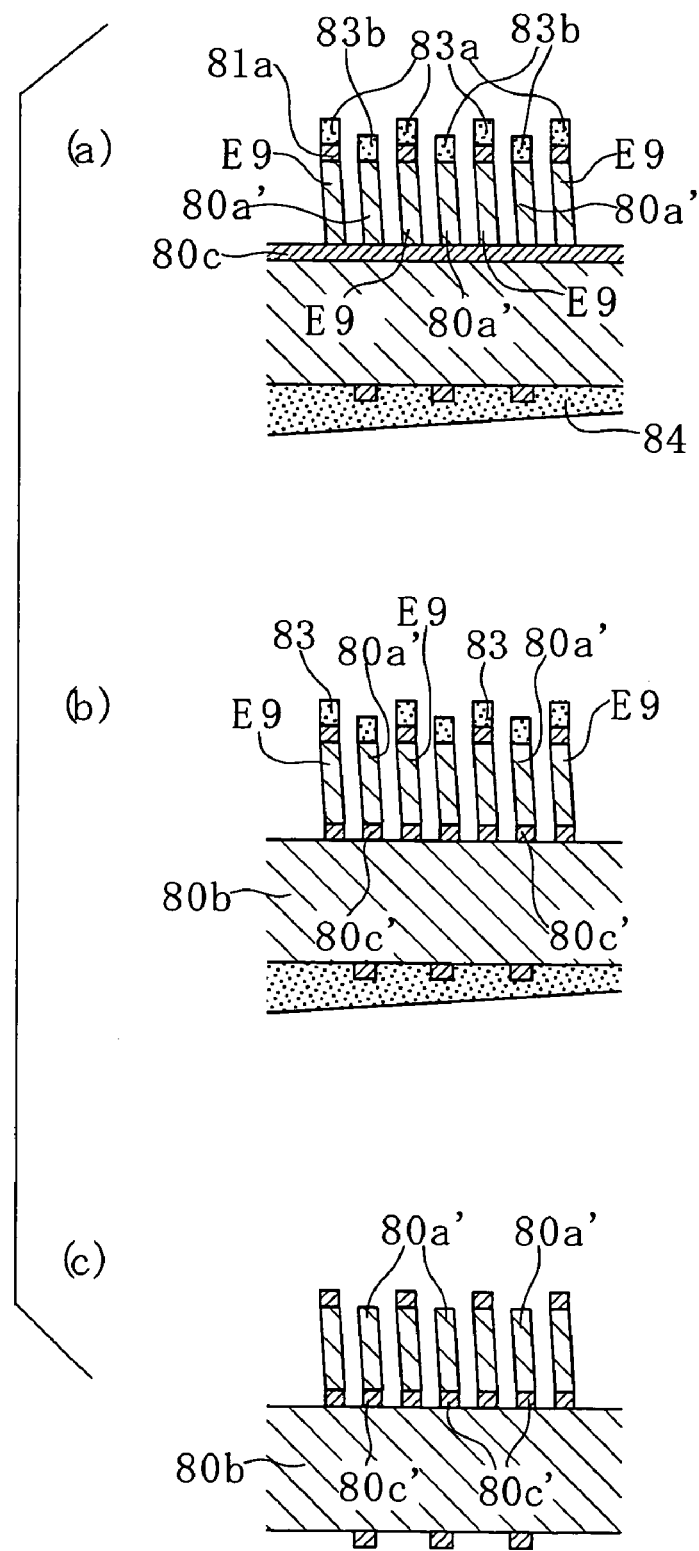
FIG. 29 shows steps following the sequence in FIG. 28.
Figure 30:
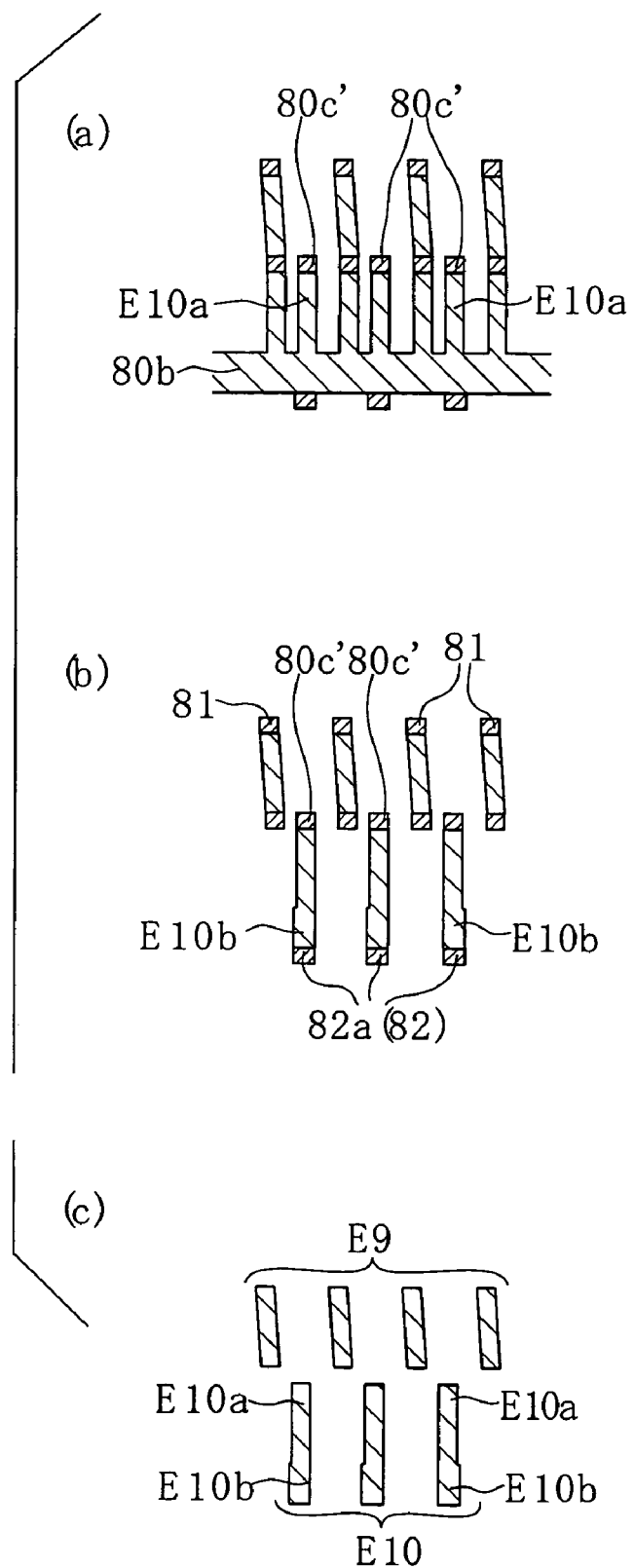
FIG. 30 shows steps following the sequence in FIG. 29.
Figure 31:
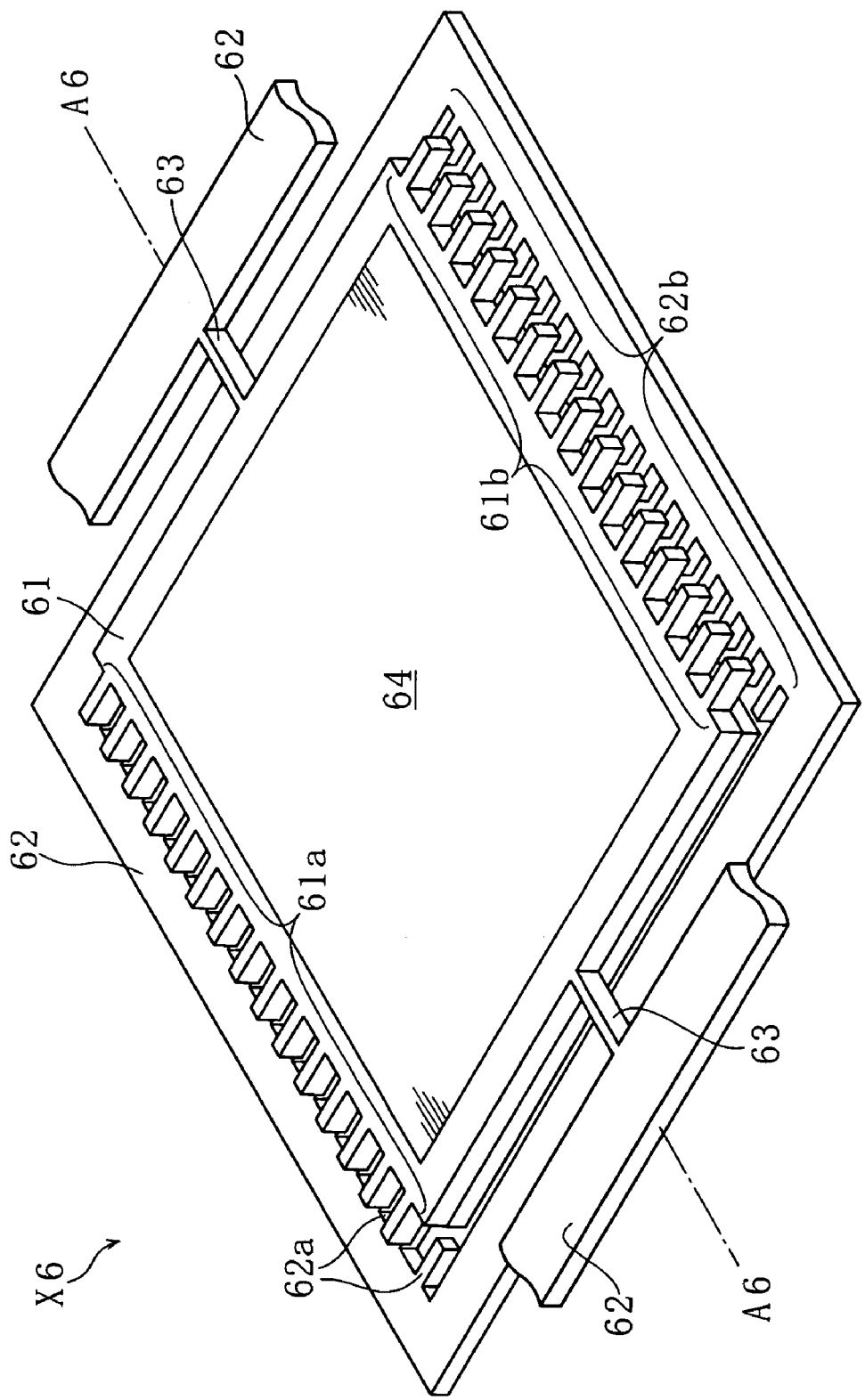
FIG. 31 is a partially non-illustrated perspective view of another conventional micromirror element.
Figure 32:
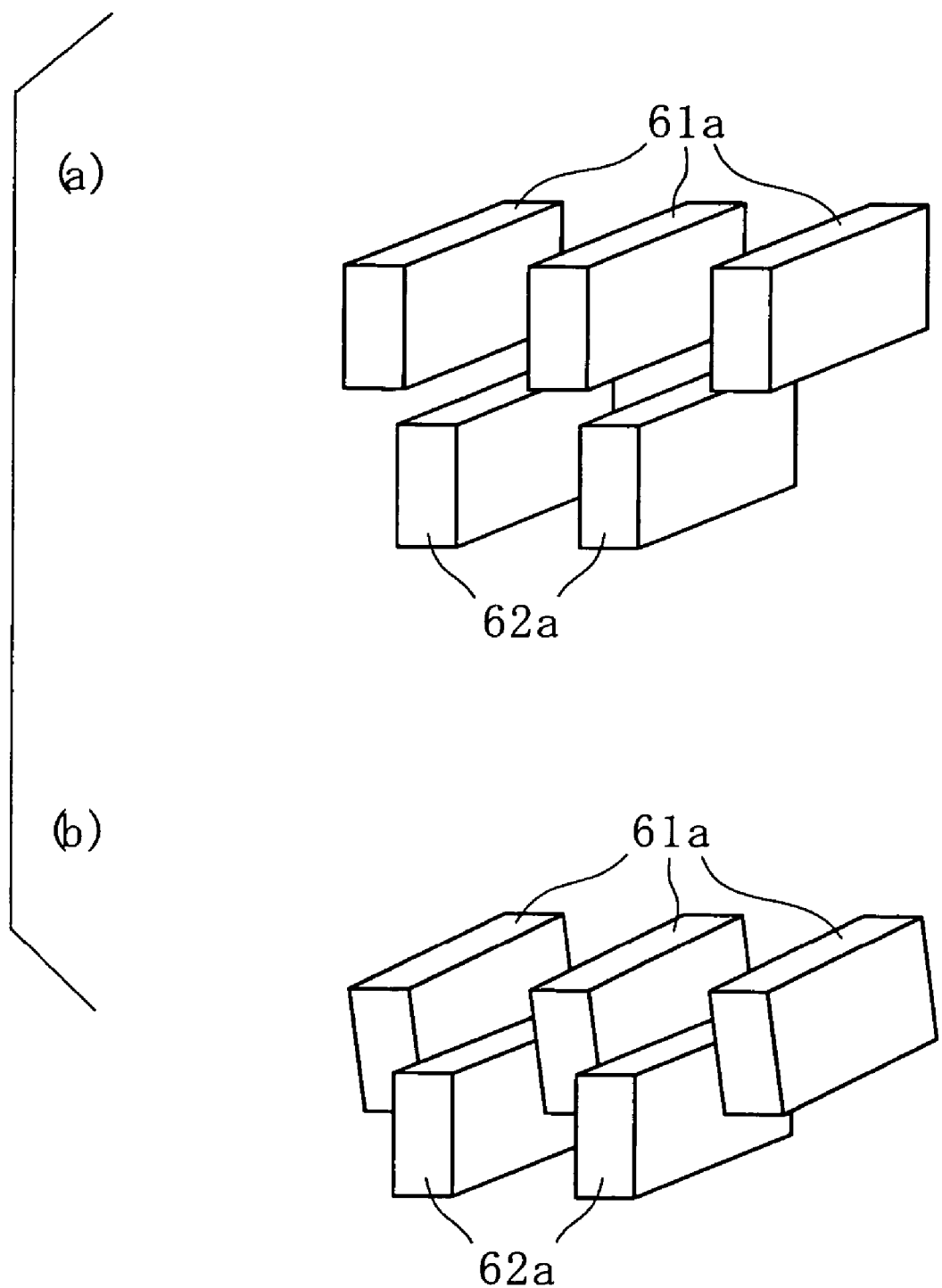
FIG. 32 shows orientations in a pair of comb-teeth electrodes.

FIG. 28 through FIG. 30 show a series of steps in the method of making comb-teeth electrode pair according to the fifth embodiment of the present invention. The method is an example through which formation is made for the pair of comb-teeth electrodes 33, 43 and the pair of comb-teeth electrodes 34, 44 in the micromirror element X5, and this method is applicable in a process of manufacturing the micromirror element X5. In FIG. 28 through FIG. 30, views of a section are given to illustrate a process of forming a pair of electrodes E9, E10 which are shown in FIG. 30(c). The section represents a section of a material substrate (a wafer having a multi-layer structure) to which micromachining is performed, and more specifically a section of a single block from which a single micromirror element is formed. The comb-teeth electrode E9 represents the comb-teeth electrodes 33, 34 of the micromirror element X5. The comb-teeth electrode E10 represents the comb-teeth electrodes 43, 44 of the micromirror element X5.

In forming the comb-teeth electrodes E9, E10, first, a similar step as described for the fourth embodiment with reference to FIG. 23(a) and FIG. 23(b) is followed. Specifically, as shown in FIG. 28(a), a prep oxide film pattern 81', an oxide film pattern 82 and a resist pattern 83 are formed on a material substrate 80. In the present embodiment, the oxide film pattern 82 includes a mask portion 82a which follows the pattern of comb-teeth electrode E10. The resist pattern 83 includes a mask portion 83a on the oxide film pattern 81' and a mask portion 83b on the silicon layer 80a. In the present embodiment, the mask portion 83a follows the pattern of comb-teeth electrodes E9 whereas the mask portion 83b follows the pattern of comb-teeth electrodes E10.

Next, as shown in FIG. 28(b), a resist film 84 is formed on the material substrate 80. The resist film 84 is to give a slant to the material substrate 80 in its thickness direction, and has a predetermined thickness gradient, so that the silicon layers 80a, 80b of the material substrate 80 will be etched most quickly at an angle with respect to the thickness direction of the material substrate during the anisotropic etching process to be described later. The angle of slant is 1 through 5 degrees for example. The resist film 84 can be formed as follows for example: First, a liquid photoresist is applied on the silicon layer 80b of the material substrate 80 by spin-coating. Examples of the photo-resist include AZP 4210 (made by AZ Electronic Materials) and AZ 1500 (made by AZ Electronic Materials). Next, the photo-resist film is patterned to a predetermined degree through an exposure process using a gray mask which has a predetermined rate of optical transparency. Thereafter, a development process is performed to partially remove the photo-resist film in its thickness direction. In this way, it is possible to form a resist film 84 which has a predetermined thickness gradient.

Thereafter, the formation of the comb-teeth electrodes E9, E10 continues by micromachining the material substrate 80 using the same process as described for the fourth embodiment with reference to FIG. 23(a) through FIG. 25(c), differing only in that the targets of the formation are comb-teeth electrodes E9, E10, and the process includes a step of removing the resist film 84.

Specifically, first, as shown in FIG. 28(c), etching is performed to the prep oxide film pattern 81' using the resist pattern 83 as a mask, to form an oxide film pattern 81 is formed which includes a mask portion 81a. The mask portion 81a, which is the portion of the prep oxide film pattern 81' masked by the mask portion 83a of the resist pattern 83, follows virtually the same pattern as the mask portion 83a, and therefore follows the pattern for the comb-teeth electrode E9 in the present embodiment.

Next, as shown in FIG. 29(a), an anisotropic etching process by DRIE is performed to the silicon layer 80a using the oxide film pattern 81 and the resist pattern 83 as masks until the insulation layer 80c is reached. This etching process yields the comb-teeth electrode E9 and a remaining mask portion 80a'. During this etching process, the material substrate 80 which is placed on the support stage in the etching chamber lies at an angle to the stage surface due to the thickness gradient of the resist film 84. Thus, the direction of etching (the direction in which the etching proceeds at its highest rate) in this etching process is inclined with respect to the thickness direction of the material substrate 80. The comb-teeth electrode E9 is represented by the portion of the silicon layer 80a masked by a stack of two mask portions 81a, 83a. The remaining mask portion 80a' is the portion of the silicon layer 80a masked by the mask portion 83b. Next, as shown in FIG. 29(b), etching is preformed to the insulation layer 80c from the side on the silicon layer 80a until the silicon layer 80b is reached. This etching process yields a remaining mask portion 80c'. The remaining mask portion 80c' is the portion of the insulation layer 80c masked by the remaining mask portion 80a'. Note that this etching does not remove portions of the insulation layer 80c which make contact with the comb-teeth electrode E9. Next, as shown in FIG. 29(c), the resist pattern 83 and the resist film 84 are removed by remover for example.

Next, as shown in FIG. 30(a), anisotropic etching by DRIE is performed to the silicon layer 80b from the side on the silicon layer 80a, to remove the remaining mask portion 80a' and form a part E10a of the comb-teeth electrodes E10. The part E10a are the portion of the silicon layer 80b masked by the remaining mask portion 80c. Note that this etching process does not remove portions of the silicon layer 80b which are beneath the comb-teeth electrode E9 in the figure. Next, as shown in FIG. 30(b), anisotropic etching by DRIE is performed to the silicon layer 80b from the side on the oxide film pattern 82, to form the remaining part E10b of the comb-teeth electrodes E10 as well as to remove the remaining portion of the silicon layer 80b which are below the comb-teeth electrode E9 in the figure. The part E10b of the comb-teeth electrode E10 is the portion of the silicon layer 80b masked by the mask portion 82a of the oxide film pattern 82. Next, as shown in FIG. 30(c), the oxide film patterns 81, 82, the remaining mask portion 80c' and portions derived from the insulation layer 80c and remaining below the electrode E9 in the figure are removed by etching. With the above-described series of steps, it is possible to form a pair of comb-teeth electrodes E9, E10 (a pair of comb-teeth electrodes 33, 43 as well as a pair of comb-teeth electrodes 34, 44 of the micromirror element X5).

According to the present method, it is possible, as described for the fourth embodiment, to achieve a high level of accuracy in terms of relative position of formation of the mask portions 81a, 83b. In other words, according to the present method, highly accurate positioning is achieved by self alignment between the mask pattern 81a of the oxide film pattern 81 and the mask portion 83b of the resist pattern 83 on the same side of the material substrate 80. Thus, in the step described with reference to FIG. 29(a), the comb-teeth electrode E9 is shaped to follow the shape of the mask portion 81a, and the remaining mask portion 80a' is shaped to follow the shape of the mask portion 83b. Further, in the step described with reference to FIG. 29(b), the remaining mask portion 80c' is shaped to follow the shape of the remaining mask portion 80a' (and therefore the mask portion 83a). In the step described with reference to FIG. 30(a), the part E10a of the comb-teeth electrode E10 (part of the comb-teeth electrode E10 closer to the comb-teeth electrode E9) is shaped to follow the shape of the remaining mask portion 80c' (and therefore the mask portion 83b). Thus, the present method enables to form the comb-teeth electrode E9 and the part E10a of the comb-teeth electrode E10 at a high level of alignment accuracy. According to the present method, the remaining part E10b of the comb-teeth electrode E10 (the portion of the comb-teeth electrode E10 which are farther from the comb-teeth electrode E9) are formed by etching in the step described with reference to FIG. 30(b), using the mask portion 82*a* of the oxide film pattern 82 as masks, and it is difficult to form the part E10*b* as precisely as the part E10*a* in terms of positional accuracy with respect to the comb-teeth electrodes E9. However, there are cases in which formation position of the part E10*b* with respect to the comb-teeth electrodes E9 may not be as accurate as are formation position of the part E10*a* with respect to the comb-teeth electrodes E9. In such a case, the present method enables to form a pair of comb-teeth electrodes E9, E10 at a practically high level of alignment accuracy in terms of relative position of formation.

In addition, the present method enables to achieve high dimensional accuracy of the comb-teeth electrodes E9, E10 in the element's thickness direction. The dimension of the comb-teeth electrode E9 in the element's thickness direction is the thickness of the silicon layer 80*a* of the material substrate 80. The dimension of the comb-teeth electrode E10 in the element's thickness direction is the thickness of the silicon layer 80*b* of the material substrate 80. Since it is possible to provide highly precise control over the thickness of silicon layers 80*a*, 80*b*, it is possible according to the present method to form the comb-teeth electrodes E9, E11 highly accurately in terms of the element's thickness-wise dimensions.

Further, according to the present method, it is possible to form a comb-teeth electrode E9 which is inclined with respect to the thickness direction of the material substrate 80 i.e. the element's thickness direction, by a predetermined angle, through the use of a resist film 84 which has a predetermined thickness gradient.

Methods of making comb-teeth electrode pair according to the present invention is applicable to manufacture of a micro oscillating element which includes a rotationally displaceable rocker. The present invention is applicable to formation of comb-teeth electrode pairs for driving the rocker, as well as to formation of comb-teeth electrode pairs for detecting the rocker's amount of rotational displacement. The comb-teeth electrode pairs for detection may be a capacitor for example, which takes the form of a pair of comb-teeth electrodes. The amount of rotational displacement of the rocker will be detected on the basis of static capacity change caused by orientation change between the pair of comb-teeth electrodes.

The invention claimed is:

1. A method of making a pair of comb-teeth electrodes from a material substrate having a laminate structure including a first conduction layer, a second conduction layer and an insulation layer between the first and the second conduction layers, the comb-teeth ejectrodes including: a first comb-teeth electrode having a laminate structure composed of a first conductor derived from the first conduction layer, a second conductor derived from the second conduction layer and an insulator derived from the insulation layer; and a second comb-teeth electrode derived from the second conduction layer, the method comprising:

a step of forming a prep first mask pattern on the first conduction layer;

a step of forming a second mask pattern including a first mask portion on the prep first mask pattern for the first comb-teeth electrode and a second mask portion on the first conduction layer for the second comb-teeth electrode, over the prep first mask pattern and the first conduction layer;

a first etching step of etching the prep first mask pattern via the second mask pattern for forming from the prep first mask pattern a first mask pattern including a third mask portion patterned to follow the first mask portion of the second mask pattern, for the first comb-teeth electrode;

a second etching step of etching the first conduction layer via the first and second mask patterns until the insulation layer is reached, to form the first conductor masked by a stack of the first and third mask portions and a first remaining mask portion of the first conduction layer masked by the second mask portion;

a third etching stop of etching the insulation layer from a side on the first conduction layer until the second conduction layer is reached, to form the insulator masked by the first conductor and a second remaining mask portion of the insulation layer masked by the first remaining mask portion, the third etching step being performed as a separate step following the second etching step;

a step of removing the second mask pattern; and a fourth etching step of etching the second conduction layer from a side on the first conduction layer while also removing the first remaining mask portion of the first conduction layer for forming the second conductor contacting the insulator and the second comb-teeth electrode masked by the second remaining mask portion of the insulation layer, in the second conduction layer.

2. The method of making a pair of comb-teeth electrodes according to claim 1, wherein the first conductor and the first remaining mask portion are formed on an inclination with respect to a thickness direction of the material substrate in the second etching step.

3. The method of making a pair of comb-teeth electrodes according to claim 1, wherein the second conductor and the second comb-teeth electrode are formed on an inclination with respect to a thickness direction of the material substrate in the fourth etching step.

4. A method of making a pair of comb-teeth electrodes from a material substrate having a laminate structure including a first conduction layer, a second conduction layer and an insulation layer between the first and the second conduction layers, the comb-teeth electrodes including a first comb-teeth electrode derived from the first conduction layer and a second comb-teeth electrode derived from the second conduction layer, the method comprising:

a step of forming a prep first mask pattern on the first conduction layer;

a step of forming a second mask pattern including a first mask portion on the prep first mask pattern for the first comb-teeth electrode and a second mask portion on the first conduction layer for the second comb-teeth electrode, over the prep first mask pattern and the first conduction layer;

a first etching step of etching the prep first mask pattern via the second mask pattern for forming from the prep first mask pattern a first mask pattern including a third mask portion patterned to follow the first mask portion of the second mask pattern, for the first comb-teeth electrode;

a second etching step of etching the first conduction layer via the first and second mask patterns until the insulation layer is reached, to form the first comb-teeth electrode masked by a stack of the first and third mask portions and a first remaining mask portion of the first conduction layer masked by the second mask portion;

a third etching step of etching the insulation layer from a side on the first conduction layer until the second conduction layer is reached, to form a second remaining mask portion of the insulation layer masked by the first remaining mask portion, the third etching step being performed as a separate step following the second etching step;

a step of removing the second mask pattern;

a fourth etching step of etching the second conduction layer from a side on the first conduction layer in a direction of a thickness of the second conduction layer a midway thereof while also removing the first remaining mask portion of the first conduction layer for forming part of the second comb-teeth electrode masked by the second remaining mask portion of the insulation layer, in the second conduction layer; and a fifth etching step of additionally etching the second conduction layer via a third mask pattern, to form a remaining part of the second comb-teeth electrode, the third mask pattern being formed on the second conduction layer and including a fourth mask portion for the second comb-teeth electrode.

5. The method of making a pair of comb-teeth electrodes according to claim 4, wherein the first comb-teeth electrode and the first remaining mask portion are formed on an inclination with respect to a thickness direction of the material substrate in the second etching step.

* * * * *